(12) United States Patent
Ujiie et al.

(10) Patent No.: US 12,041,799 B2
(45) Date of Patent: *Jul. 16, 2024

(54) IMAGING ELEMENT, STACKED-TYPE IMAGING ELEMENT, IMAGING APPARATUS, AND MANUFACTURING METHOD OF IMAGING ELEMENT

(71) Applicants: SONY GROUP CORPORATION, Tokyo (JP); SONY SEMICONDUCTOR SOLUTIONS CORPORATION, Kanagawa (JP)

(72) Inventors: Yasuharu Ujiie, Kanagawa (JP); Ichiro Takemura, Kanagawa (JP); Masaki Orihashi, Kanagawa (JP); Yohei Hirose, Kanagawa (JP)

(73) Assignees: Sony Group Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/842,506

(22) Filed: Jun. 16, 2022

(65) Prior Publication Data

US 2022/0310951 A1   Sep. 29, 2022

Related U.S. Application Data

(63) Continuation of application No. 16/466,387, filed as application No. PCT/JP2017/037573 on Oct. 17, 2017, now Pat. No. 11,495,762.

(30) Foreign Application Priority Data

Dec. 16, 2016   (JP) .................................. 2016-244224

(51) Int. Cl.
*H01L 27/28*   (2006.01)
*H01L 27/30*   (2006.01)
(Continued)

(52) U.S. Cl.
CPC ............. *H10K 30/87* (2023.02); *H10K 19/20* (2023.02); *H10K 30/30* (2023.02); *H10K 30/82* (2023.02);
(Continued)

(58) Field of Classification Search
CPC ................. H01L 27/286; H01L 27/307; H01L 27/14647; H01L 51/0061; H01L 51/442; H01L 51/447; H01L 51/4253
See application file for complete search history.

(56) References Cited

U.S. PATENT DOCUMENTS 11,495,762 B2 *   11/2022   Ujiie ..................... H01L 27/286
2012/0143544 A1   6/2012   Murata et al.
(Continued)

FOREIGN PATENT DOCUMENTS

| CN | 204720453 | 10/2015 |
| JP | 2007-088033 | 4/2007 |

(Continued)

OTHER PUBLICATIONS

Kundu et al. (High-Tg carbazole derivatives as blue-emitting hole-transporting materials for electrolumine—scent devices, Adv. Funct. Mater., 2003, 13, No. 6, 445-452. (Year: 2003) (Year: 2003).*

(Continued)

*Primary Examiner* — Bijan Ahvazi
(74) *Attorney, Agent, or Firm* — Sheridan Ross PC

(57) ABSTRACT

An imaging element which is formed by sequentially stacking at least an anode, an anode-side buffer layer, a photoelectric conversion layer, and a cathode, in which the anode-side buffer layer includes a material having structural formula (Continued)

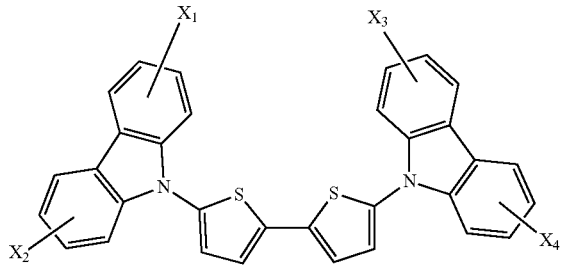

(1)

in which thiophene and carbazole are combined.

12 Claims, 17 Drawing Sheets

(51) Int. Cl.
| | |
|---|---|
| H01L 51/42 | (2006.01) |
| H01L 51/44 | (2006.01) |
| H10K 19/20 | (2023.01) |
| H10K 30/30 | (2023.01) |
| H10K 30/82 | (2023.01) |
| H10K 30/87 | (2023.01) |
| H10K 39/32 | (2023.01) |
| H10K 85/60 | (2023.01) |
| H01L 27/146 | (2006.01) |

(52) U.S. Cl.
CPC ........... *H10K 39/32* (2023.02); *H10K 85/636* (2023.02); *H01L 27/14647* (2013.01); *H10K 85/655* (2023.02); *H10K 85/6572* (2023.02)

(56) References Cited

U.S. PATENT DOCUMENTS

| | | | |
|---|---|---|---|
| 2018/0114926 A1* | 4/2018 | Ujiie | H01L 51/4273 |
| 2018/0157331 A1* | 6/2018 | Raffa | G06F 3/0304 |
| 2020/0099003 A1 | 3/2020 | Ujiie et al. | |

FOREIGN PATENT DOCUMENTS

| | | |
|---|---|---|
| JP | 2011-082508 | 4/2011 |
| JP | 2012019235 A | 1/2012 |
| JP | 2016063165 A | 4/2016 |
| JP | 2016201449 A | 12/2016 |
| JP | 2017-039654 | 2/2017 |
| JP | 2017-054939 | 3/2017 |
| JP | 2018-556221 | 3/2022 |
| JP | 2022-029586 | 4/2022 |
| WO | WO 2015/163349 | 10/2015 |
| WO | WO 2016/185858 | 11/2016 |
| WO | WO 2018/110072 | 6/2018 |

OTHER PUBLICATIONS

Jiangtao Hu, Bingbin Wu, Sujong Chae, Joshua Lochala, Yujing Bi, and Jie Xiao, Achieving highly reproducible results in graphite-based Li-ion full coin cells, Joule 5, 1011-1023, May 19, 2021 ᵃ 2021 Elsevier Inc (Year: 2021).*
Official Action for China Patent Application No. 2017800756735, dated Apr. 28, 2022, 13 pages.
Kundu et al., "High-Tg Carbazole Derivatives as Blue-Emitting Hole-Transporting Materials for Electroluminescent Devices," Advanced Functional Materials, Jun. 2003, vol. 13, No. 6, pp. 445-452.
Lu et al., "Synthesis and Properties of Multi-Triarylamine-Substituted Carbazole-Based Dendrimers with an Oligothiophene Core for Potential Applications in Organic Solar Cells and Light-Emitting Diodes," Chemistry of Materials, Dec. 2006, vol. 18, No. 45, pp. 6194-6203.
Takimiya et al., "Thienoacene-Based Organic Semiconductors," Advanced Materials, vol. 23, 2011, pp. 4347-4370.
International Search Report and Written Opinion for International (PCT) Patent Application No. PCT/JP2017/037573, dated Dec. 26, 2017, 7 pages.
Official Action for U.S. Appl. No. 16/466,387, dated Sep. 8, 2020, 8 pages. Restriction Requirement.
Official Action for U.S. Appl. No. 16/466,387, dated Nov. 13, 2020, 9 pages.
Official Action for U.S. Appl. No. 16/466,387, dated Feb. 24, 2021, 12 pages.
Official Action for U.S. Appl. No. 16/466,387, dated Jul. 23, 2021, 10 pages.
Official Action for U.S. Appl. No. 16/466,387, dated Nov. 8, 2021, 10 pages.
Notice of Allowance for U.S. Appl. No. 16/466,387, dated Mar. 31, 2022, 9 pages.
Official Action (with English translation) for Japan Patent Application No. 2023-036171, dated May 7, 2024, 13 pages.

* cited by examiner

FIG. 1
Fig. 1A
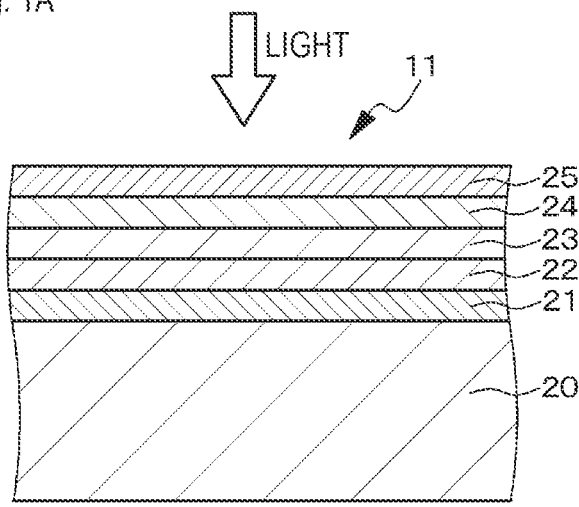
Fig. 1B
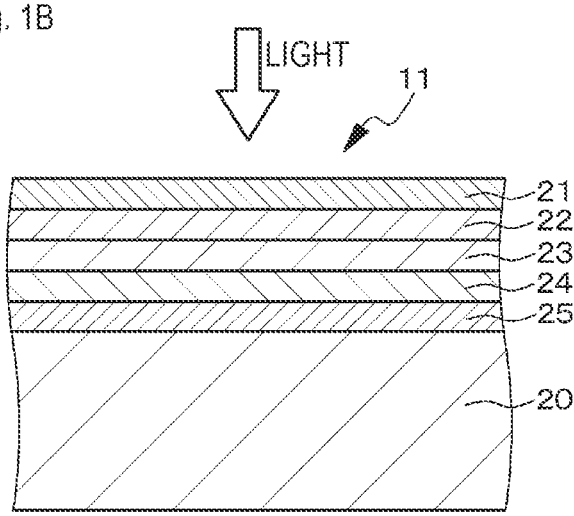

FIG. 2
Fig. 2A
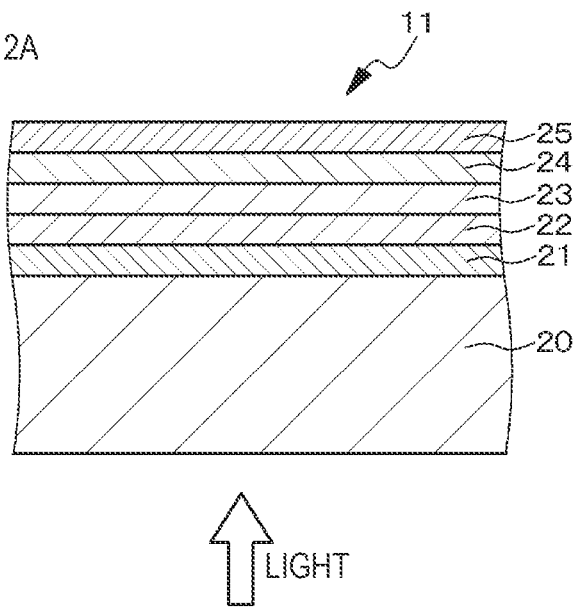
Fig. 2B
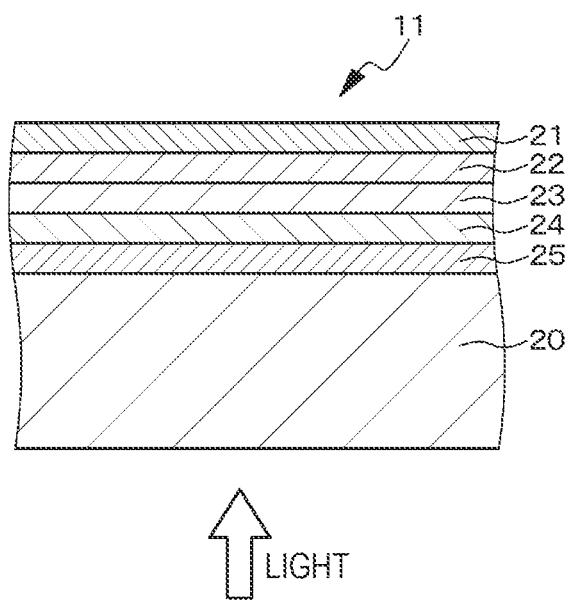

FIG. 3
Fig. 3A
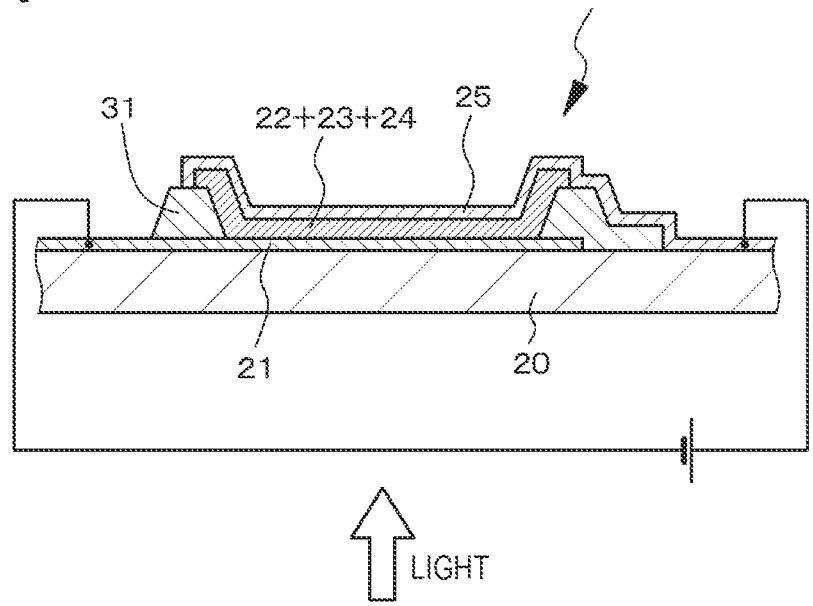
Fig. 3B
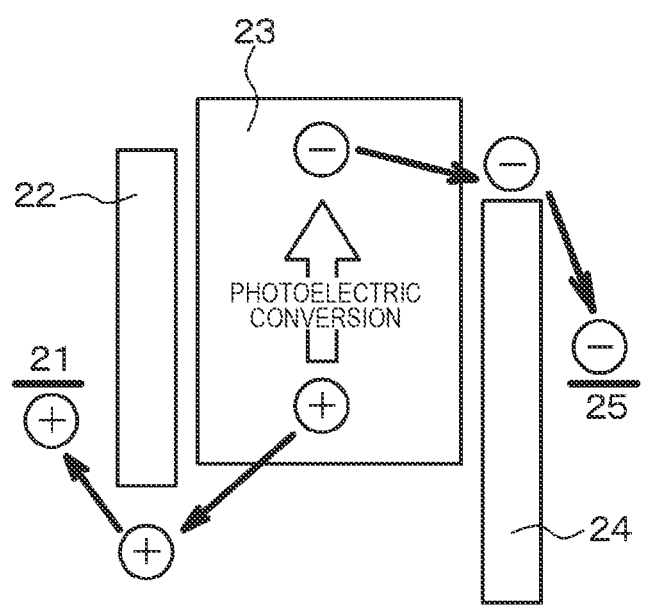

FIG. 5
Fig. 5A
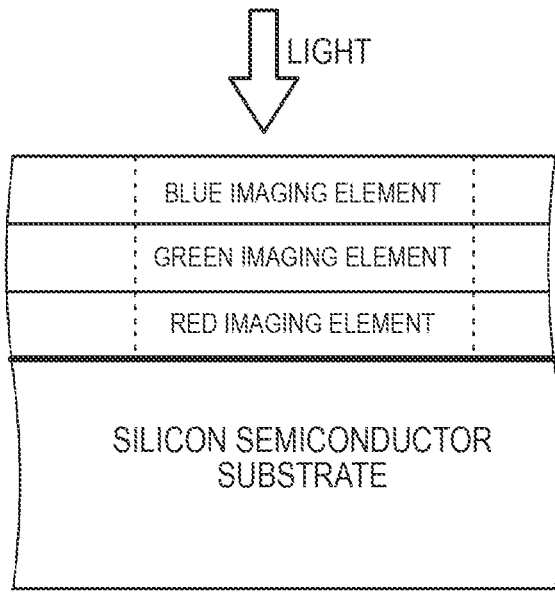
Fig. 5B
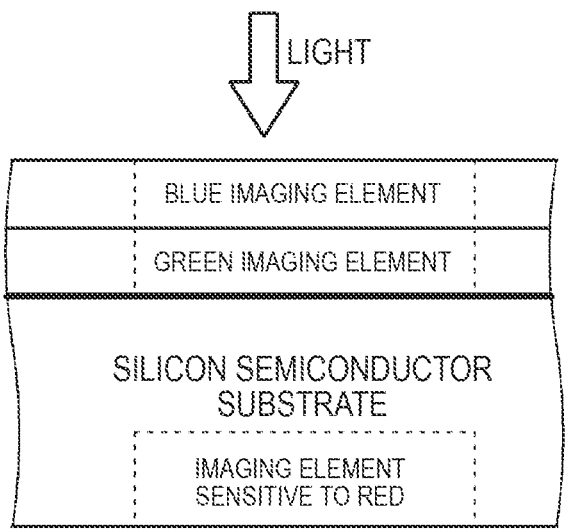

FIRST STEP

INTERMEDIATE 1-1

SECOND STEP

INTERMEDIATE 1-2

THIRD STEP

INTERMEDIATE 1-3

FOURTH STEP

COMPOUND (A)

IMAGING ELEMENT, STACKED-TYPE IMAGING ELEMENT, IMAGING APPARATUS, AND MANUFACTURING METHOD OF IMAGING ELEMENT

CROSS REFERENCE TO RELATED APPLICATIONS

This application is a continuation of U.S. application Ser. No. 16/466,387, filed on Jun. 4, 2019, which is a national stage application under 35 U.S.C. 371 and claims the benefit of PCT Application No. PCT/JP2017/037573 having an international filing date of 17 Oct. 2017, which designated the United States, which PCT application claimed the benefit of Japanese Patent Application No. 2016-244224 filed 16 Dec. 2016, the entire disclosures of each of which are incorporated herein by reference.

TECHNICAL FIELD

The present disclosure relates to an imaging element, a stacked-type imaging element, an imaging apparatus, and a manufacturing method of the imaging element.

BACKGROUND ART

The application of imaging elements to cameras for smartphones, surveillance cameras, rear-view monitors for automobiles, and collision prevention sensors rather than only digital cameras and video camcorders has become widespread and gained attention in recent years. In addition, improvement in performance and diversification of functions of imaging elements have been achieved in order to respond to various applications, and imaging elements keep evolving. However, imaging elements using silicon (Si) as a photoelectric conversion material have become mainstream. In addition, miniaturization of pixels for improving recording density has progressed, and the size of an individual pixel has reached substantially 1 µm. The light absorption coefficient of Si is about $10^3$ cm$^1$ to $10^4$ cm$^1$ in the visible light range, and a photoelectric conversion layer of an imaging element is normally positioned at a place with a depth of 3 µm or more in a silicon semiconductor substrate. Here, as the miniaturization of the pixel size progresses further, the aspect ratio of the pixel size and the depth of the photoelectric conversion layer increases. As a result, light leakage from an adjacent pixel or light incidence angles are limited, which leads to deterioration in performance of the imaging element.

As a solution to the above problem, organic materials having a high absorption coefficient have gained attention. In other words, photoelectric conversion using an organic semiconductor material is performed, rather than photoelectric conversion using an inorganic semiconductor material. Such an imaging element is called an "organic imaging element." The absorption coefficient of an organic material in the visible light range is about $10^5$ cm$^1$ or higher, a thickness of a photoelectric conversion layer of an organic imaging element or a stacked-type imaging element, which will be described next, can be thinned, and thus improvement in sensitivity and increase in the number of pixels are considered to be possible while preventing false colors, and therefore development is actively underway.

Stacked-type imaging elements having spectral sensitivity corresponding to red, green, and blue which are formed by stacking a plurality of imaging elements have been developed and gained attention. A stacked-type imaging element does not need a color separation optical system and three types of electrical signals (image signals) corresponding to red, green, and blue are taken out from one pixel. Therefore, a light utilization rate becomes higher, openings become wider, and thus a false signal such as moiré seldom occurs.

However, although there are a variety of problems in putting organic imaging elements into practical use, it is necessary to clarify criteria required for imaging elements with respect to various initial characteristics such as photo-electric conversion efficiency, dark current characteristics, an S/N ratio that is the ratio of a bright current and a dark current, afterimage characteristics, and heat resistance in the manufacturing process. In addition, various technologies have been proposed to solve the problem of such initial characteristics.

The imaging element disclosed in Patent Literature 1, for example, is regarded as being capable of satisfying required external quantum efficiency characteristics while satisfying required dark current characteristics by satisfying the conditions that electron affinity of the electron blocking layer is greater than the work function of the adjacent electrode by 1.3 eV or more, and ionization potential of the electron blocking layer is equal to or smaller than ionization potential of the adjacent photoelectric conversion layer.

CITATION LIST

Patent Literature

Patent Literature 1: JP 2007-088033A

DISCLOSURE OF INVENTION

Technical Problem

However, even in a case in which a material satisfying the conditions disclosed in the above-described patent publication is used for a buffer layer on the anode side, the material does not necessarily reach the level of practical use of the imaging element, and in particular, improvement in the dark current characteristics that significantly affect the S/N ratio and afterimage (a phenomenon in which a signal remains even after emitted light or reflected light from a moving subject disappears when imaging and thus the subject is illustrated as if it has a tail) characteristics has been strongly demanded.

Therefore, an objective of the present disclosure is to provide an imaging element having excellent dark current characteristics and afterimage characteristics, a stacked-type imaging element and an imaging apparatus having the imaging element, and a manufacturing method of the imaging element.

Solution to Problem

An imaging element according to a first aspect, a second aspect, or a third aspect of the present disclosure for achieving the above objective is formed by sequentially stacking an anode, an anode-side buffer layer, a photoelectric conversion layer, and a cathode, in the imaging element according to the first aspect of the present disclosure, the anode-side buffer layer includes a material having structural formula (I) in which thiophene and carbazole are combined, in the imaging element according to the second aspect of the present disclosure, the anode-side buffer layer includes a material having structural formula (2) in which thiophene and carbazole are combined, and in the imaging element according to the third aspect of the present disclosure, the anode-side buffer layer includes a material having structural formula (3) in which thiophene and carbazole are combined.

group, a phenyl naphthyl group, a tolyl group, a xylyl group, a terphenyl group, an anthracenyl group, a phenanthryl group, a pyrenyl group, a tetracenyl group, a fluoranthenyl group, a pyridinyl group, a quinolinyl group, an acridinyl group, an indole group, an imidazole group, a benzimidazole group, and a thienyl group.

In the imaging element according to a third aspect of the present disclosure, the anode-side buffer layer can include a material having structural formula (4) or structural formula (5): in which thiophene and carbazole are combined.

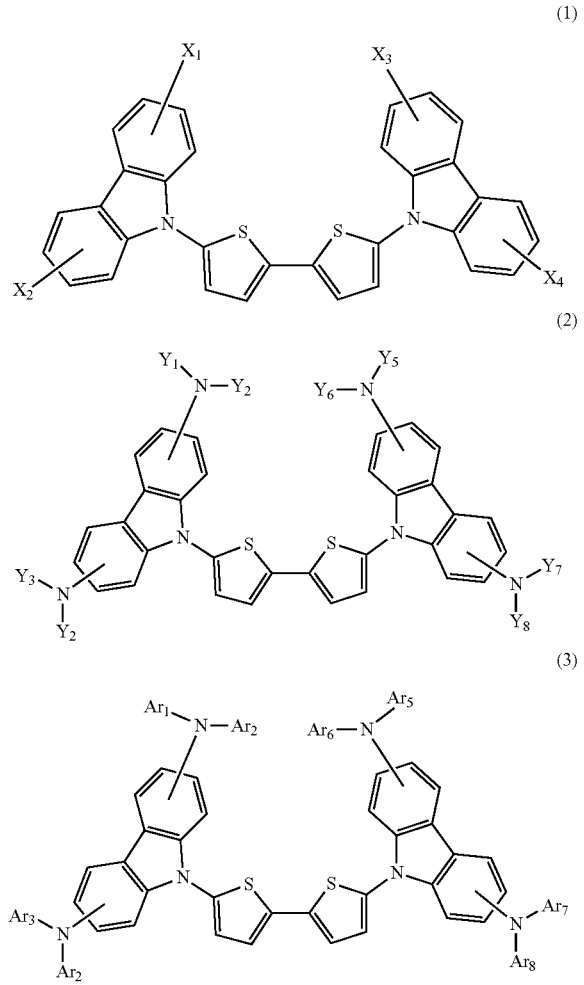

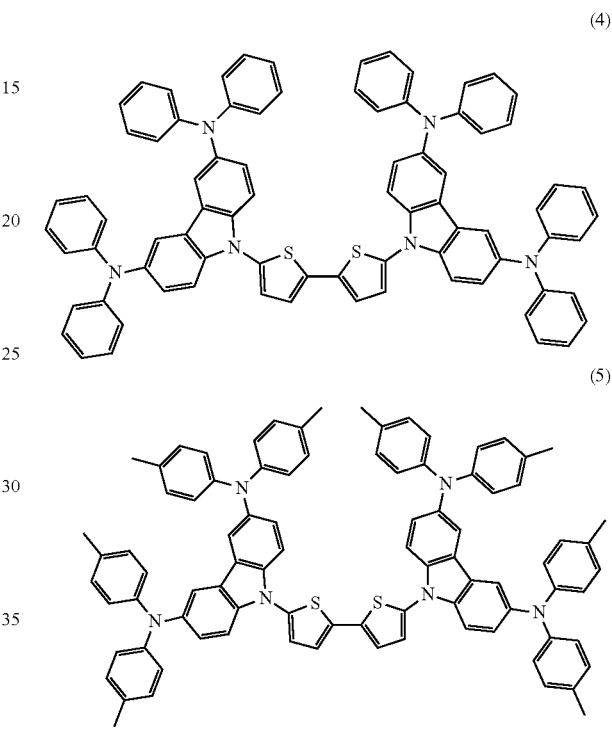

Here, $X_1$, $X_2$, and $X_3$ in structural formula (1) and $Y_1$, $Y_2$, $Y_3$, $Y_4$, $Y_5$, $Y_6$, $Y_7$, and $Y_8$ in structural formula (2) are each independently a group consisting of an alkyl group, an aryl group, an arylamino group, an aryl group having an arylamino group as a substituent, and a carbazolyl group, and may or may not have a substituent, the aryl group and the aryl group having an arylamino group as a substituent are an aryl group selected from a group consisting of a phenyl group, a biphenyl group, a naphthyl group, a naphthyl phenyl group, a phenyl naphthyl group, a tolyl group, a xylyl group, a terphenyl group, an anthracenyl group, a phenanthryl group, a pyrenyl group, a tetracenyl group, a fluoranthenyl group, a pyridinyl group, a quinolinyl group, an acridinyl group, an indole group, an imidazole group, a benzimidazole group, and a thienyl group, and the alkyl group may be an alkyl group selected from a group consisting of a methyl group, an ethyl group, a propyl group, a butyl group, a pentyl group, and a hexyl group, or a linear or branched alkyl group.

In addition, here, $Ar_1$, $Ar_2$, $Ar_3$, $Ar_4$, $Ar_5$, $Ar_6$, $Ar_7$, and $Ar_8$ in structural formula (3) are each independently an aryl group selected from the group consisting of a phenyl group, a biphenyl group, a naphthyl group, a naphthyl phenyl A stacked-type imaging element of the present disclosure for achieving the above objective is formed by stacking at least one of the imaging elements according to the first aspect, the second aspect, or the third aspect of the present disclosure.

The imaging apparatus according to the first aspect of the present disclosure for achieving the above objective has a plurality of the imaging elements according to the first aspect, the second aspect, or the third aspect of the present disclosure, and the imaging apparatus according to the second aspect of the present disclosure for achieving the above objective has a plurality of stacked-type imaging elements of the present disclosure.

In the manufacturing method of an imaging element of the present disclosure for achieving the above objective, the imaging element is formed by sequentially stacking at least an anode, an anode-side buffer layer, a photoelectric conversion layer, and a cathode, in which the anode-side buffer layer includes a material having structural formula (1), structural formula (2), structural formula (3), structural formula (4), or structural formula (5) in which thiophene and carbazole are combined, and the anode-side buffer layer is formed by using a physical vapor deposition method.

Advantageous Effects of Invention

In the imaging element according to the first to third aspects of the present disclosure, the stacked-type imaging element of the present disclosure, and the imaging apparatus according to the first and second aspects of the present disclosure, the anode-side buffer layer is formed of a material having structural formula (1), structural formula (2), or structural formula (3) in which thiophene and carbazole are combined, and thus dark current characteristics and after-image characteristics can be improved at the same time. In addition, in the manufacturing method of the imaging element of the present disclosure, the anode-side buffer layer is formed by using a physical vapor deposition method, and thus the imaging element can be further miniaturized. Further, the effects described in the present specification are merely examples and are not limitative, and additional effects may be exhibited.

BRIEF DESCRIPTION OF DRAWINGS

FIG. 1A and FIG. 1B are conceptual diagrams illustrating sectional views of an imaging element of Embodiment 1.

FIG. 2A and FIG. 2B are conceptual diagrams illustrating sectional views of an imaging element of Embodiment 1.

FIG. 3A and FIG. 3B are a schematic partial sectional view of an imaging element for evaluation of Embodiment 1 and a diagram schematically illustrating the flow of holes and electrons generated from photoelectric conversion, respectively.

FIG. 5A and FIG. 5B are conceptual diagrams of a stacked-type imaging element of Embodiment 2.

MODE(S) FOR CARRYING OUT THE INVENTION

Figure 4:
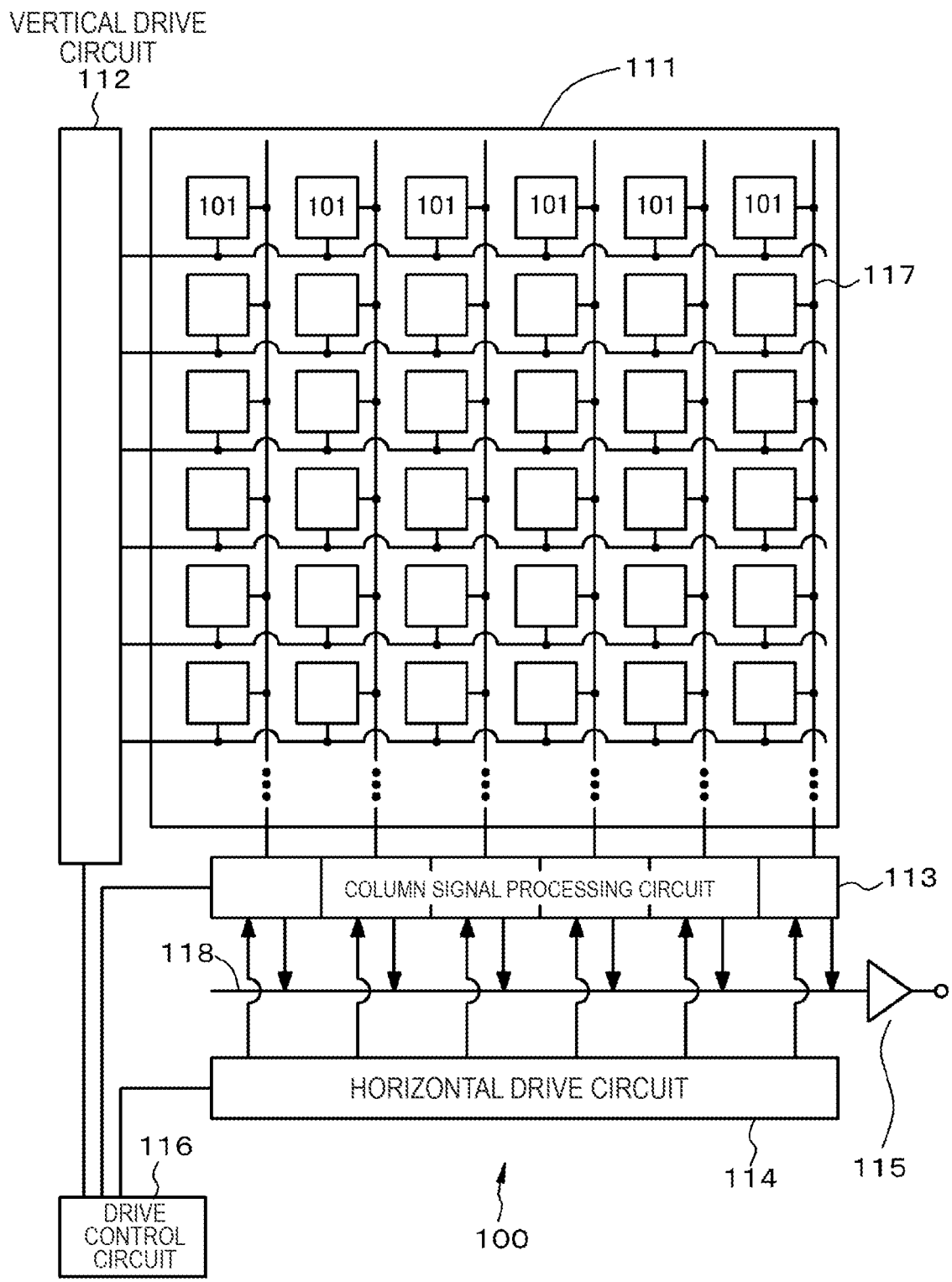
FIG. 4 is a conceptual diagram of the imaging apparatus of Embodiment 1.

The present disclosure will be described below on the basis of embodiments with reference to the drawings; however, the present disclosure is not limited to the embodiments, and various numbers and materials appearing in the embodiments are examples. Further, description will be provided in the following order.
1. Overall description of imaging element according to first to third aspects of present disclosure, stacked-type imaging element according to present disclosure, and imaging apparatus according to first and second aspects of present disclosure
2. Embodiment 1 (imaging element according to first to third aspects of present disclosure, stacked-type imaging element according to present disclosure, and imaging apparatus according to first and second aspects of present disclosure)
3. Embodiment 2 (modification of Embodiment 1)
4. Embodiment 3 (modification of Embodiment 2)
5. Others <Overall Description of Imaging Element According to First to Third Aspects of Present Disclosure, Stacked-Type Imaging Element According to Present Disclosure, and Imaging Apparatus According to First and Second Aspects of Present Disclosure>

In an imaging element according to first to third aspects of the present disclosure including preferred modes described above, an imaging element according to the first to third aspects of the present disclosure forming a stacked-type imaging element of the present disclosure, and an imaging element according to the first to third aspects of the present disclosure forming an imaging apparatus according to the first and second aspects of the present disclosure (these imaging elements will be collectively referred to as "the imaging element or the like of the present disclosure"), the difference between the highest occupied molecular orbital value (HOMO value) of a material forming an anode-side buffer layer and the HOMO value of a p-type material (specifically, a p-type organic semiconductor material) forming a photoelectric conversion layer is desirably in the range of ±0.2 eV.

In the imaging element or the like according to an embodiment of the present disclosure including preferred modes described above, the HOMO value of a p-type material (specifically, p-type organic semiconductor material) forming the photoelectric conversion layer is preferably a value from −5.6 eV to −5.7 eV.

In addition, in the imaging element or the like according to an embodiment of the present disclosure including various preferred modes described above, carrier mobility of a material forming the anode-side buffer layer is desirably $5 \times 10^{-6}$ cm$^2$/V·s or higher, and preferably $1 \times 10^{-5}$ cm$^2$/V·s or higher.

In addition, in the imaging element or the like according to an embodiment of the present disclosure including various preferred modes described above, in order to prevent light absorption of the anode-side buffer layer from adversely affecting a layer positioned on the cathode side in a case in which light is incident from the anode side, it is desirable for a material forming the anode-side buffer layer to preferably have little light absorption in the visible light range, and specifically, for an absorption spectrum of the material forming the anode-side buffer layer to have an absorption maximum at a wavelength of 425 nm or lower, and preferably a wavelength of 400 nm or lower.

In addition, in the imaging element or the like according to an embodiment of the present disclosure including various preferred modes described above, the anode and the cathode may be formed of a transparent conductive material. Alternatively, any one of the anode and the cathode (electrode on the light incidence side) is formed of a transparent conductive material, and the other may be formed of a metal material. In addition, in this case, the anode positioned on the light incidence side may be formed of a transparent conductive material and the cathode may be formed of Al, Al—Si—Cu, or Mg—Ag, or the cathode positioned on the light incidence side may be formed of a transparent conductive material and the anode may be formed of Al—Nd or Al—Sm—Cu.

The imaging element according to the first aspect to third aspects of the present disclosure including various preferred modes described above contains a photoelectric conversion element.

In the imaging element or the like according to an embodiment of the present disclosure including various preferred modes described above, a thickness of the anode-side buffer layer is not limited; however examples thereof may be preferably $5 \times 10^9$ m to $5 \times 10^{-8}$ m, or $5 \times 10^{-9}$ m to $2.5 \times 10^8$ m.

Specific examples of the imaging element or the like according to an embodiment of the present disclosure include an imaging element (for convenience, referred to as a "first-type blue imaging element") having a photoelectric conversion layer which absorbs blue light (light of 425 nm to 495 nm) (for convenience, referred to as a "first-type blue photoelectric conversion layer") and having sensitivity to blue, an imaging element (for convenience, referred to as a "first-type green imaging element") having a photoelectric conversion layer which absorbs green light (light of 495 nm to 570 nm) (for convenience, referred to as a "first-type green photoelectric conversion layer") and having sensitivity to green, and an imaging element (for convenience, referred to as a "first-type red imaging element") having a photoelectric conversion layer which absorbs red light (light of 620 nm to 750 nm) (for convenience, referred to as a "first-type red photoelectric conversion layer") and having sensitivity to red.

In addition, an imaging element (an imaging element in which the anode-side buffer layer is not provided, or an imaging element in which the anode-side buffer layer is not formed of a material having structural formula (1), structural formula (2), structural formula (3), structural formula (4), or structural formula (5) in which thiophene and carbazole are combined) of the related art which is an imaging element having sensitivity to blue will be referred to as a "second-type blue imaging element" for convenience, an imaging element having sensitivity to green will be referred to as a "second-type green imaging element" for convenience, an imaging element having sensitivity to red will be referred to as a "second-type red imaging element" for convenience, a photoelectric conversion layer forming the second-type blue imaging element will be referred to as a "second-type blue photoelectric conversion layer" for convenience, a photoelectric conversion layer forming the second-type green imaging element will be referred to as a "second-type green photoelectric conversion layer" for convenience, and a photoelectric conversion layer forming the second-type red imaging element will be referred to as a "second-type red photoelectric conversion layer" for convenience.

The stacked-type imaging element according to an embodiment of the present disclosure includes at least one imaging element or the like (photoelectric conversion element) according to an embodiment of the present disclosure, and specific examples thereof include:

[A] the configuration and structure in which the first type blue photoelectric conversion unit, the first type green photoelectric conversion unit and the first type red photoelectric conversion unit are stacked in the vertical direction, and each of the control units of the first type blue imaging element, the first type green imaging element, and the first type red imaging element is provided on the semiconductor substrate;

[B] the configuration and structure in which the first type blue photoelectric conversion unit and the first type green photoelectric conversion unit are stacked in the vertical direction, the second-type red photoelectric conversion layer is disposed below these two layers of the first type photoelectric conversion units, and each of the control units of the first type blue imaging element, the first type green imaging element, and the second type red imaging element is provided on the semiconductor substrate;

[C] the configuration and structure in which the second-type blue photoelectric conversion unit and the second-type red photoelectric conversion unit are disposed below the first-type green photoelectric conversion unit, and each of the control units of the first type green imaging element, the second type blue imaging element, and the second type red imaging element is provided on the semiconductor substrate; and

[D] the configuration and structure in which the second-type green photoelectric conversion unit and the second-type red photoelectric conversion unit are disposed below the first-type blue photoelectric conversion unit, and each of the control units of the first type blue imaging element, the second type green imaging element, and the second type red imaging element is provided on the semiconductor substrate.

Further, the arrangement order of the photoelectric conversion units of the imaging element in the vertical direction is preferably the blue photoelectric conversion unit, the green photoelectric conversion unit, and the red photoelectric conversion unit in order from the light incidence side, or the green photoelectric conversion unit, the blue photoelectric conversion unit, and the red photoelectric conversion unit in order from the light incidence side. The reason for this is that light having a shorter wavelength is absorbed on the light incidence side with high efficiency. Since red has the longest wavelength among the three colors, it is preferable to position the red photoelectric conversion unit at the lowermost layer when viewed from the light incidence side. One pixel is formed by the stacked structure of these imaging elements. Furthermore, the first-type infrared photoelectric conversion unit may be provided. Here, it is preferable that the photoelectric conversion layer of the first-type infrared photoelectric conversion unit may be formed of an organic material, for example, and is the lowermost layer of the stacked structure of the first-type imaging element, and is disposed above the second-type imaging element. Alternatively, the second-type infrared photoelectric conversion unit may be provided below the first-type photoelectric conversion unit. The various second-type photoelectric conversion layers described above may be formed on a semiconductor substrate. Further, a photoelectric conversion unit is formed by sequentially stacking at least an anode, a photoelectric conversion layer, and a cathode.

In the first-type imaging element, for example, any one of the anode and the cathode is formed on an interlayer insulating layer provided on the semiconductor substrate. The second-type imaging element formed on the semiconductor substrate may be a back surface illuminated type or a front surface illuminated type.

In the imaging element (photoelectric conversion element) or the like according to an embodiment of the present disclosure, in a case in which the photoelectric conversion layer is formed of an organic material, the photoelectric conversion layer may be formed in any of the following modes:
(a) a p-type organic semiconductor layer formed of a single layer or multiple layers;
(b) a stacked structure of a p-type organic semiconductor layer and an n-type organic semiconductor layer; a stacked structure of a p-type organic semiconductor layer, a mixed layer (bulk heterostructure) of a p-type organic semiconductor material and an n-type organic semiconductor material, and an n-type organic semiconductor layer; a stacked structure of a p-type organic semiconductor layer and a mixed layer (bulk heterostructure) of a p-type organic semiconductor material and an n-type organic semiconductor material; a stacked structure of an n-type organic semiconductor layer and a mixed layer (bulk heterostructure) of a p-type organic semiconductor material and an n-type organic semiconductor material; and
(c) a mixture (bulk heterostructure) of a p-type organic semiconductor material and an n-type organic semiconductor material.
However, the stacking order may be arbitrarily switched. In addition, one or two or more kinds of p-type organic semiconductor materials or n-type organic semiconductor materials may be included in the same layer. Not only two types but also three or more types of semiconductor materials may be included in the bulk heterostructure.

Although examples of the p-type organic semiconductor material include naphthalene derivatives; anthracene derivatives; phenanthrene derivatives; pyrene derivatives; perylene derivatives; tetracene derivatives; pentacene derivatives; quinacridone derivatives; thienoacene-based materials represented by thiophene derivatives, thienothiophene derivatives, benzothiophene derivatives, benzothienobenzothiophene (BTBT) derivatives, dinaphthothienothiophene (DNTT) derivatives, dianthracenothienothiophene (DATT) derivatives, benzobisbenzothiophene (BBBT) derivatives, thienobisbenzothiophene (TBBT) derivatives, dibenzothienobisbenzothiophene (DBTBT) derivatives, dithienobenzodithiophene (DTBDT) derivatives, dibenzothienodithiophene (DBTDT) derivatives, benzodithiophene (BDT) derivatives, naphthodithiophene (NDT) derivatives, anthracenodithiophene (ADT) derivatives, tetracenodithiophene (TDT) derivatives, and pentacenodithiophene (PDT) derivatives (which will be referred to as "thienoacene-based materials represented by various derivatives" below); triallylamine derivatives; carbazole derivatives; picene derivatives; chrysene derivatives; fluoranthene derivatives; phthalocyanine derivatives; subphthalocyanine derivatives; subporphyrazine derivatives; metal complexes having heterocyclic compounds as ligands; polythiophene derivatives; polybenzothiadiazole derivatives; polyfluorene derivatives, and the like, among these, a p-type material (p-type organic semiconductor material) having the HOMO value from −5.6 eV to −5.7 eV, for example, a thienoacene-based material represented by quinacridone derivatives or various derivatives described above is preferably used as described above, and a combination of the anode-side buffer layer with a material having structural formula (1), structural formula (2), structural formula (3), structural formula (4), or structural formula (5) in which thiophene and carbazole are combined may be exemplified.

Examples of the n-type organic semiconductor material include fullerenes and fullerene derivatives <for example, fullerenes such as C60, C70, or C74 (high order fullerenes), endohedral fullerenes, etc.), fullerene derivatives (e.g., a fullerene fluoride, a PCBM fullerene compound, a fullerene multimer, etc.), an organic semiconductor material having a higher (deeper) HOMO value and lowest unoccupied molecular orbital (LUMO) value than the p-type organic semiconductor material, and transparent inorganic metal oxide. Specifically, examples of the n-type organic semiconductor material include a heterocyclic compound containing a nitrogen atom, an oxygen atom and a sulfur atom, for example, organic molecules and organometallic complexes having pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivative, polyphenylene vinylene derivatives, polybenzothiadiazole derivatives, polyfluorene derivatives and the like in a part of the molecular skeleton, and subphthalocyanine derivatives. Examples of a functional group or the like included in fullerene derivatives include a halogen atom; a linear, branched or cyclic alkyl group or phenyl group; a functional group having a linear or condensed aromatic compound; a functional group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a functional group having a chalcogenide; a phosphine group; a phosphonic group; derivatives thereof.

Although a thickness of the photoelectric conversion layer formed of an organic material (which may be referred to as an "organic photoelectric conversion layer") is not limited, examples of the thickness include values in the range of, for example, $1\times10^{-8}$ m to $5\times10^{-7}$ m, preferably $2.5\times10^{-8}$ m to $3\times10^{-7}$ m, more preferably $2.5\times10^{8}$ m to $2\times10^{7}$ m, even more preferably $1\times10^{7}$ m to $1.8\times10^{7}$ m. Note that organic semiconductors are mostly classified into the p-type and the n-type, and the p-type means that holes are easily transported and the n-type means that electrons are easily transported. The interpretation of organic semiconductors is not limited to having holes or electrons as thermally excited majority carriers like inorganic semiconductors.

In addition, it is desirable for an absorption coefficient α of the photoelectric conversion layer to be $1\times10^{4}$ cm$^{-1}$ or higher, and preferably $1.5\times10^{4}$ cm$^{-1}$ or higher, and a molar absorption coefficient c of the photoelectric conversion layer to be $1\times10^{4}$ dm$^{3}\cdot$mol$^{1}$ l$\cdot$cm$^{-1}$ or higher, and preferably $1.8\times10^{4}$ dm$^{3}\cdot$mol$^{-1}\cdot$cm$^{1}$ or higher. Furthermore, although the sublimation temperature of a material forming the photoelectric conversion layer is not limited, it is desirably 250°

C. or higher. Although the molecular weight of the material forming the photoelectric conversion layer is not limited, examples thereof are 2000 or lower, preferably 500 to 1500, and more preferably 500 to 1000.

Alternatively, examples of the material forming an organic photoelectric conversion layer that photoelectrically converts light of green wavelength include rhodamine-based pigment, melacyanine-based pigment, quinacridone-based derivative, subphthalocyanine-based pigment (subphthalocyanine derivative), etc. Examples of the material forming an organic photoelectric conversion layer that photoelectrically converts light of blue wavelength include coumarinic acid pigment, tris-8-hydricoxyquinoline aluminum (Alq3), melacyanin-based pigment, etc. Examples of the material forming an organic photoelectric conversion layer that photoelectrically converts light of red wavelength include phthalocyanine-based pigment and subphthalocyanine-based pigment (subphthalocyanine derivative).

Alternatively, examples of inorganic materials forming the photoelectric conversion layer include crystal silicon, amorphous silicon, microcrystalline silicon, crystalline selenium, amorphous selenium, and a compound semiconductor material including CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, or AgInSe$_2$ which is a chalcopyrite-based compound, GaAs, InP, AlGaAs, InGaP, AlGaInP, or InGaAsP which is a Group III-V compound, and further CdSe, CdS, In$_2$Se$_3$, In$_2$S$_3$, Bi$_2$Se$_3$, Bi$_2$S$_3$, ZnSe, ZnS, PbSe, or PbS. In addition, quantum dots formed of these materials can also be used for the photoelectric conversion layer.

Alternatively, the photoelectric conversion layer can have a stacked structure of a lower semiconductor layer and an upper photoelectric conversion layer. By providing such a lower semiconductor layer, re-bond in the photoelectric conversion layer at the time of charge accumulation can be prevented, efficiency in transfer of charges accumulated in the photoelectric conversion layer to the anode or cathode can be increased, and generation of a dark current can be curbed. A material forming the upper photoelectric conversion layer positioned on the light incidence side may be appropriately selected from the various materials described above for forming the photoelectric conversion layer. Meanwhile, as a material funning the lower semiconductor layer, it is preferable to use a material having a high value of a band gap (e.g., a value of a band gap higher than or equal to 3.0 e), and moreover a higher mobility than a material forming the photoelectric conversion layer. Specifically, oxide semiconductor materials such as IGZO; a transition metal dichalcogenide; silicon carbide; diamond; graphene; carbon nanotubes; organic semiconductor materials such as condensed polycyclic hydrocarbon compounds and condensed heterocyclic compounds, and the like can be exemplified. Alternatively, examples of materials forming the lower semiconductor layer include, in a case in which charge to be accumulated is electrons, a material having a higher ionization potential than a material forming the photoelectric conversion layer, and in a case in which charge to be accumulated is holes, a material having lower electron affinity than a material forming the photoelectric conversion layer. Alternatively, it is preferable for the impurity concentration of a material forming the lower semiconductor layer to be $1\times10^{18}$ cm$^3$ or lower. The lower semiconductor layer may have a single layer configuration or a multilayer configuration.

In order to improve electrical bondability between the anode-side buffer layer and the anode or the photoelectric conversion layer, or to adjust the electric capacity of the imaging element, a first intermediate layer may be provided between the anode and a first buffer layer or the first buffer layer and the photoelectric conversion layer. The first intermediate layer may be provided adjacent to the anode-side buffer layer (specifically, for example, adjacent to the photoelectric conversion layer side). Examples of a material forming the first intermediate layer include triarylamine compounds, benzidine compounds, aromatic amine-based materials represented by styrylamine compounds, carbazole derivatives, naphthalene derivatives, anthracene derivatives, phenanthrene derivatives, pyrene derivatives, perylene derivatives, tetracene derivatives, pentacene derivatives, perylene derivatives, picene derivatives, chrysene derivatives, fluoranthene derivatives, phthalocyanine derivatives, subphthalocyanine derivatives, hexaazatriphenylene derivatives, metal complexes having heterocyclic compounds as ligands, thienoacene-based materials represented by the various derivatives described above, and compounds including poly(3,4-ethylenedioxythiophene)/polystyrene sulfonate [PEDOT/PSS], polyaniline, molybdenum oxide (Moor), ruthenium oxide (RuO$_x$), vanadium oxide (VO$_x$), and tungsten oxide (WO$_x$). Particularly, for the purpose of significantly reducing the electric capacity, a thienoacene-based material represented by the above-described derivatives may be preferably used in a case in which a thickness of the first intermediate layer is increased.

A cathode-side buffer layer may be formed between the cathode and the photoelectric conversion layer. Preferred examples of materials to be used for the cathode-side buffer layer include materials having a larger (deeper) work function than a material used for the anode-side buffer layer, for example, a material which has organic molecules and organometallic complexes in which a heterocyclic ring containing a nitrogen (N) atom is part of a molecular skeleton and further absorbs little light of the visible light range such as pyridine, quinoline, acridine, indole, imidazole, benzimidazole, and phenanthroline. In addition, in a case in which the cathode-side buffer layer is formed of a thin film having a thickness in the range of about $5\times10^{-9}$ m to $2\times10^{-8}$ m, fullerenes and derivatives thereof represented by C60 and C70 that absorb light in the visible light range at a wavelength of 400 nm to 700 nm can also be used. In addition, examples of compounds thereof include, specifically, alkali metals such as lithium (Li), sodium (Na), and potassium (K), halides, oxides, and complex compounds thereof, alkali earth metals such as magnesium (Mg) and calcium (Ca), and halides, oxides, and complex compounds thereof. However, materials forming the cathode-side buffer layer are not limited to the above. In addition, a second intermediate layer may be formed between the organic photoelectric conversion layer and the cathode. Examples of materials forming the second intermediate layer include aromatic ring-based compounds and hydrazone-based compounds. Examples of aromatic ring-based compounds include, specifically, monoamine-based compounds and derivatives thereof, alkylene bond-based compounds and derivatives thereof, arylene bond-based compound and derivatives thereof, phenyleneciamine-based compounds and derivatives thereof, and starburst-based compound and derivatives thereof.

A single-panel color imaging apparatus can be configured using the imaging apparatus according to the first and second aspects of the present disclosure. In addition, with the imaging apparatus according to the first and second aspects of the present disclosure, for example, digital cameras, video camcorders, smartphone cameras, surveillance cameras, and rear-view monitors for automobiles can be configured.

In the imaging apparatus according to the second aspect of the present disclosure including the stacked-type imaging element, unlike the imaging apparatus including the Bayer-array imaging element (i.e., spectroscopy for blue, green, and red is not performed using a color filter), a plurality of photoelectric conversion layers having sensitivity to light of predetermined wavelengths is stacked in the light incidence direction in the same pixel to form one pixel, and thus improvement of sensitivity and pixel density per unit volume can be achieve. Furthermore, since an organic material has a high absorption coefficient, a film thickness of a photoelectric conversion layer can be thinner as compared to a conventional Si-based photoelectric conversion layer, and light leakage from adjacent pixels and restriction on the light incidence angle can be alleviated. Moreover, since the conventional Si-based imaging element produces color signals by performing interpolation processing among three-color pixels, false color is generated, but false color can be suppressed in the imaging apparatus according to the second aspect of the present disclosure including the stacked-type imaging element. Further, since the organic photoelectric conversion layer itself functions as a color filter, color separation can be performed without disposing a color filter.

On the other hand, in the imaging apparatus according to the first aspect of the present disclosure, due to using a color filter, the request for spectral characteristics of blue, green and red can be alleviated, and moreover, mass productivity is high. Examples of the arrangement of the imaging element in the imaging apparatus according to the first aspect of the present disclosure include an interline arrangement, a G stripe-RB checkered array, a G stripe-RB full-checkered array, a checkered complementary color array, a stripe array, a diagonal stripe array, a primary color difference array, a field color difference sequential array, a flame color difference sequential array, an MOS-type array, a modified MOS-type array, a flame interleave array and a field interleave array in addition to a Bayer array. Here, one pixel (or subpixel) is formed by one imaging element.

A pixel region in which a plurality of the imaging elements according to the first to third aspects of the present disclosure or the stacked-type imaging elements according to an embodiment of the present disclosure are arrayed is formed of a plurality of pixels regularly arranged in a two-dimensional array. Generally, the pixel region includes an effective pixel region which actually receives light, amplifies the signal charges generated by photoelectric conversion and reads it out to the drive circuit, and a black reference pixel region for outputting optical black serving as a reference of a black level. The black reference pixel region is generally disposed at the outer peripheral portion of the effective pixel region.

In the imaging element or the like according to an embodiment of the present disclosure including various preferred modes and configurations described above, light is radiated, photoelectric conversion is generated on the photoelectric conversion layer, carriers including holes and electrons are separated. Further, an electrode from which holes are extracted is referred to as an anode, and an electrode from which electrons are extracted is defined as a cathode.

In a case in which the stacked-type imaging element is configured, the anode and the cathode can be formed of a transparent conductive material. Alternatively, in a case in which the imaging elements or the like according to an embodiment of the present disclosure are arranged in a plane, for example, a Bayer array, one electrode of the anode and the cathode may be formed of a transparent conductive material and the other electrode may be formed of a metal material. In this case, specifically, the cathode positioned on the light incidence side may be formed of a transparent conductive material, and the anode may be formed of, for example, Al—Nd (an alloy of aluminum and neodymium) or Al—Sm—Cu (ASC which is an alloy of aluminum, samarium, and copper) as described above. Alternatively, the anode positioned on the light incidence side may be formed of a transparent conductive material, and the cathode may be formed of Al (aluminum), Al—Si—Cu (an alloy of aluminum, silicon, and copper), or Mg—Ag (an alloy of magnesium and silver).

Further, an electrode formed of a transparent conductive material may be referred to as a "transparent electrode." Here, the band gap energy of the transparent conductive material is 2.5 eV or more, and preferably, 3.1 eV or more. Examples of a transparent conductive material forming an transparent electrode include conductive metal oxides, and specific examples thereof include indium oxide, indium-tin oxide (ITO including Sn-doped $In_2O_3$, crystalline ITO and amorphous ITO), indium-zinc oxide (IZO) in which indium is added to zinc oxide as a dopant, indium-gallium oxide (IGO) in which indium is added to gallium oxide as a dopant, indium-gallium-zinc oxide (IGZO, In—GaZnO$_4$) in which indium and gallium are added to zinc oxide as a dopant, indium-tin-zinc oxide (ITZO) in which indium and tin are added to zinc oxide as dopant), IFO (F-doped $In_2O_3$), tin oxide ($SnO_2$), ATO (Sb-doped $SnO_2$), FTO (F-doped $SnO_2$), zinc oxide (including ZnO doped with other elements), aluminum-zinc oxide (AZO) in which aluminum is added to zinc oxide as a dopant, gallium-zinc oxide (GZO) in which gallium is added to zinc oxide as a dopant, titanium oxide ($TiO_2$), antimony oxide, spinel type oxide, an oxide having a $YbFe_2O_4$ structure. Alternatively, a transparent electrode having a base layer of gallium oxide, titanium oxide, niobium oxide, nickel oxide or the like may be given as an example. The thickness of the transparent electrode may be $2\times10^{-8}$ m to $2\times10^{-7}$ m, preferably $3\times10^{-8}$ m to $1\times10^{-7}$ m.

Alternatively, in a case where transparency is unnecessary, a conductive material forming an anode having a function as an electrode for extracting holes is preferably a conductive material having a high work function (e.g., $\varphi=4.5$ eV to 5.5 eV), and specific examples thereof include gold (Au), silver (Ag), chromium (Cr), nickel (Ni), palladium (Pd), platinum (Pt), iron (Fe), iridium (U), germanium (Ge), osmium (Os), rhenium (Re), tellurium (Te), or alloys thereof. On the other hand, a conductive material forming an cathode having a function as an electrode for extracting electrons is preferably a conductive material having a low work function (e.g., $\varphi=3.5$ eV to 4.5 eV), and specific examples thereof include alkali metals (e.g., Li, Na, K, etc.) and the fluorides or oxides thereof, alkaline earth metals (e.g., Mg, Ca, etc.) and the fluorides or oxides thereof, aluminum (Al), zinc (Zn), tin (Sn), thallium (Tl), a sodium-potassium alloy, an aluminum-lithium alloy, a magnesium-silver alloy, indium and rare earth metals such as ytterbium. Alternatively, examples of the material forming an anode or cathode include metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (in), tin (Sn), iron (Fe), cobalt (Co), molybdenum (Mo) or the like, or alloys including these metal elements, as conductive particles formed of these metals, conductive particles of alloys containing these metals, polysilicon containing impurities, carbon-based materials, oxide semiconductors materials, conductive materials such carbon nanotubes, graphene and the like, and a laminated structure of layers containing these elements. Furthermore, examples of the material forming an anode or cathode include organic materials (conductive polymers) such as poly (3,4-ethylenedioxythiophene)/polystyrenesulfonate [PEDOT/PSS]. Further, a paste or ink prepared by mixing these conductive materials into a binder (polymer) may be cured to be used as an electrode.

A dry method or wet method may be used as a film-forming method of an anode and a cathode. Examples of the dry method include a physical vapor deposition method (PVD method) and a chemical vapor deposition method (CVD) method. Examples of the film-forming method using the principle of PVD method include a vacuum evaporation method using resistance heating or high frequency heating, an electron beam (EB) evaporation method, various sputtering methods (magnetron sputtering method, RF-DC coupled bias sputtering method, ECR sputtering method, facing-target sputtering method and high frequency sputtering method), an ion plating method, a laser ablation method, a molecular beam epitaxy method, and a laser transfer method. Furthermore, examples of the CVD method include a plasma CVD method, a thermal CVD method, an organometallic (MO) CVD method, and a photo CVD method. On the other hand, examples of the wet method include an electrolytic plating method and an electroless plating method, a spin coating method, an ink jet method, a spray coating method, a stamping method, a micro contact printing method, a flexographic printing method, an offset printing method, a gravure printing method, a dipping method, etc. As for patterning, chemical etching such as shadow mask, laser transfer, photolithography and the like, physical etching by ultraviolet light, laser and the like may be used. A planarization is treated to the anode and a cathode if necessary, examples of a planarization technique include a laser planarization method, a reflow method, a chemical mechanical polishing (CMP) method, etc.

A dry film formation method and a wet film formation method may be given as examples of a film-forming method for various organic layers. Various PVD methods may be given as examples of the dry film formation method, and specifically the methods include a vacuum deposition method using resistance heating, high frequency or electron beam heating, a flash deposition method, a plasma deposition method, an EB deposition method, various sputtering method (bipolar sputtering method, direct current sputtering method, DC magnetron sputtering method, RF-DC coupled bias sputtering method, ECR sputtering method, facing-target sputtering method, high frequency sputtering method and ion beam sputtering method), a DC (direct current) method, an RF method, a multi-cathode method, an activation reaction method, an electric field vapor deposition method, a high-frequency ion plating method and a reactive ion plating method, a laser ablation method, a molecular beam epitaxy method, a laser transfer method, and a molecular beam epitaxy (MBE) method. Alternatively, in a case in which imaging elements for forming an imaging apparatus are integrated, a method of forming a pattern on the basis of a PLD method (pulsed laser deposition method) may also be employed. Furthermore, examples of a chemical vapor deposition (CVD) method include a plasma CVD method, a thermal CVD method, an MOCVD method, and a photo CVD method. On the other hand, as a wet method, a spin coating method; a dipping method; a casting method; a micro contact printing method; a drop casting method; various printing methods such as a screen printing method, an ink jet printing method, an offset printing method, a gravure printing method and a flexographic printing method; a stamping method; a spray coating method; various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method and a calendar coater method. Further, examples of a solvent in the coating method include a nonpolar or low polar organic solvents such as toluene, chloroform, hexane, and ethanol, however, the solvent is not limited thereto. As for patterning, chemical etching such as shadow mask, laser transfer, photolithography and the like, physical etching by ultraviolet light, laser and the like may be used. Examples of a planarization technique for various organic layers include a laser planarization method, a reflow method, etc. Further, in order to cope with miniaturization of one layer of the imaging elements, it is preferable to employ a dry film forming method (specifically, PVD method) as a film forming method for the organic layers and the anode-side buffer layer.

The imaging elements according to the first to third aspects of the present disclosure can be formed on a substrate in some cases. Here, examples of the substrate include organic polymers exemplified by polymethyl methacrylate (polymethylmethacrylate or PMMA), polyvinyl alcohol (PVA), polyvinyl phenol (PVP), polyethersulfone (PES), polyimide, polycarbonate (PC), polyethylene terephthalate (PET), or polyethylene naphthalate (PEN) (having a form of a polymeric material such as a plastic film, a plastic sheet, or a plastic substrate formed of a polymeric material having flexibility), or mica. If a substrate formed of such a polymeric material having flexibility is used, for example, incorporation or integration of an electronic device with an imaging element or the like having a curved surface shape is possible. Alternatively, examples of the substrate include various glass substrates, various glass substrates with an insulating film formed on their surfaces, quartz substrates, quartz substrates with an insulating film formed on their surfaces, silicon semiconductor substrates, silicon semiconductor substrates with an insulating film formed on their surfaces, various alloys such as stainless steel, and metal substrates formed of various metals. In addition, examples of an insulating film include a silicon oxide-based material (e.g., $SiO_X$ or spin-on-glass (SOG)); silicon nitride ($SiN_Y$); silicon oxynitride (SiON); aluminum oxide ($Al_2O_3$); a metal oxide or a metal salt. In addition, an organic insulating film can be formed, and examples of materials thereof include, for example, lithography-enabled polyphenol-based materials, polyvinylphenol-based materials, polyimide-based materials, polyamide-based materials, polyamide imide-based materials, fluorinated polymer materials, borazine-silicon polymer materials, truxene-based materials, and the like. Alternatively, a conductive substrate with such an insulating film formed on a surface (a substrate formed of a metal such as gold or aluminum, or a substrate formed of highly-oriented graphite) may also be used. Although it is desirable for the surface of the substrate to be smooth, it does not matter if it has roughness to the extent that it does not adversely affect characteristics of the photoelectric conversion layer. By forming a silanol derivative on the surface of the substrate using a silane coupling method, forming a thin film formed of a thiol derivative, a carboxylic acid derivative, a phosphoric acid derivative, or the like thereon using an SAM method or the like, or forming a thin film formed of an insulating metal salt or metal complex using a CVD method or the like, adhesion between the electrode and the substrate may be improved. In addition, the electrodes can be treated using oxygen plasma, argon plasma, nitrogen plasma, ozone, or the like. This treatment can be performed regardless of whether there is an electrode coating layer or before and after coating. A transparent substrate is a substrate formed of a material that does not excessively absorb light incident on the photoelectric conversion layer through the substrate.

The electrodes and the photoelectric conversion layer may be covered by a coating layer in some cases. Examples of materials forming the coating layer include inorganic insulating materials exemplified by silicon oxide-based materials; silicon nitride ($SiN_Y$); a metal oxide high-dielectric constant insulating film such as aluminum oxide ($Al_2O_3$) or the like as well as organic insulating materials (organic polymers) exemplified by polymethyl methacrylate (PMMA); polyvinyl phenol (PVP); polyvinyl alcohol (PVA); polyimide, polycarbonate (PC); polyethylene terephthalate (PET); polystyrene; silanol derivatives (silane coupling agents) such as N-2 (aminoethyl) 3-aminopropyltrimethoxysilane (AEAPTMS), 3-mercaptopropyltrimethoxysilane (MPTMS), octadecyltrichlorosilane (OTS) or the like; straight-chain hydrocarbons having a functional group capable of bonding to the electrode at one end such as octadecanethiol, dodecyl isocyanate and the like, and combinations thereof. In addition, examples of the silicon oxide-based materials include silicon oxide ($SiO_X$), BPSG, PSG, BSG, AsSG, PbSG, silicon oxynitride (SiON), spin-on-glass (SOG), and low dielectric constant materials (e.g., polyaryl ether, cycloperfluorocarbon polymers and benzocyclobutene, cyclic fluoro resins, polytetrafluoroethylene, fluoroaryl ether, fluorinated polyimide, amorphous carbon and organic SOG). Examples of insulating layer forming methods include, for example, the above-described dry film forming method and wet film forming method.

A photoelectric conversion element can be formed of the imaging element of the present disclosure, optical sensors, image sensors, rear-view monitors for automobiles, and solar cells in addition to imaging apparatuses (solid-state imaging apparatuses) such as television cameras can be formed using such photoelectric conversion elements.

An on-chip micro lens and a light shielding layer may be provided in the imaging element or the imaging apparatus if necessary. A shutter for controlling incidence of light on the imaging element may be installed if necessary, or an optical cut filter may be included in accordance with a purpose of the imaging apparatus. A drive circuit for driving imaging elements and wiring may be provided in the imaging apparatus.

The configuration and structure of the floating diffusion layer, the amplification transistor, reset transistor and select transistor forming the control unit may be the same as the conventional floating diffusion layer, amplification transistor, reset transistor and select transistor. Also, the drive circuit may have well-known configuration and structure.

Either one of an anode and a cathode is connected to the floating diffusion layer and the gate section of the amplification transistor, and a contact hole portion may be formed to connect the electrode to the floating diffusion layer and the gate section of the amplification transistor. Examples of a material forming the contact hole portion include a high melting point metal such as tungsten, Ti, Pt, Pd, Cu, TiW, TiN, TiNW, $WSi_2$, $MoSi_2$ or the like, metal silicide, or a stacked structure of layers formed of these materials (e.g., Ti/TiN/W).

For example, in a case where the imaging apparatus is stacked with a readout integrated circuit (ROIC), the stacking may be performed by overlaying a drive substrate on which a readout integrated circuit and a connection portion formed of copper (Cu) are formed and an imaging element on which a connection portion is formed such that the connection portions are in contact with each other, and joining the connection portions, and it is also possible to join the connection portions using a solder bump or the like.

Embodiment 1

Embodiment 1 relates to the imaging element according to first to third aspects of the present disclosure and the imaging apparatus according to the first aspect of the present disclosure.

As conceptual diagrams are illustrated in FIG. 1A, FIG. 1B, FIG. 2A, and FIG. 2B, an imaging element (photoelectric conversion element) 11 of Embodiment 1 has at least an anode 21, an anode-side buffer layer 22, a photoelectric conversion layer 23, and a cathode 25 sequentially stacked. Specifically, the imaging element 11 of Embodiment 1 has the anode 21, the anode-side buffer layer 22, the organic photoelectric conversion layer 23, a cathode-side buffer layer 24, and the cathode 25 stacked in order. In addition, the anode-side buffer layer 22 includes a material having the above-described structural formula (1), structural formula (2), or structural formula (3) in which thiophene and carbazole are combined. More specifically, in Embodiment 1, the anode-side buffer layer 22 is formed of a material having the following structural formula (4) [compound (A)] or a material having the following structural formula (5) [compound (B)] in which thiophene and carbazole are combined. In the imaging elements illustrated in FIG. 1A and FIG. 2B, light is incident from the cathode side. On the other hand, in the imaging elements illustrated in FIG. 1B and FIG. 2A, light is incident from the anode side. Light may also be incident from a substrate 20 side. Further, a flow of holes (indicated by "+" in circles) and electrons (indicated by "−" in circles) generated from photoelectric conversion is schematically illustrated in FIG. 3B.

(4)

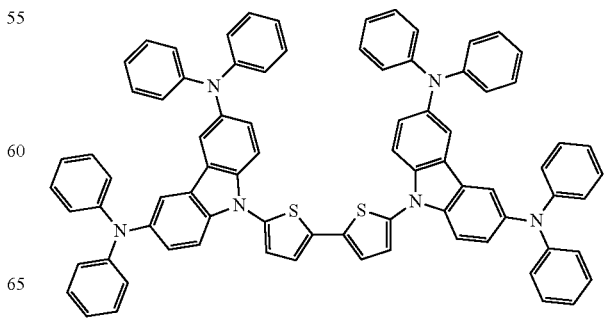

-continued (5)

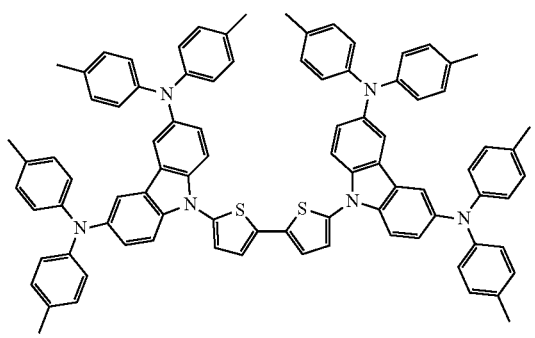

An imaging apparatus 40 of Embodiment 1 may have a plurality of imaging elements 11 of Embodiment 1. Specifically, blue imaging elements, green imaging elements, and red imaging elements are arranged in a plane like a Bayer array.

Materials forming the organic photoelectric conversion layer are as described above, or may be as follows.

That is, examples of materials for the organic photoelectric conversion layer 23 included in a blue imaging element having the organic photoelectric conversion layer that is sensitive to blue and absorbs blue light (light having a wavelength of 425 nm to 495 nm) include, in addition to quinacridone or quinacridone derivatives, and thienoacen-based materials represented by the above-described various derivatives, naphthalene derivatives, anthracene derivatives, phenanthrene derivatives, pyrene derivatives, tetracene derivatives, picene derivatives, chrysene derivatives, fluoranthene derivatives, metal complex and the like as p-type organic semiconductor materials, and fullerene and fullerene derivatives, and organic semiconductor materials having a higher (deeper) HOMO value and LUMO value than those of p-type organic semiconductor materials as n-type organic semiconductor materials. More specifically, two or more types of materials are extracted from organic light absorbing materials or organic transparent materials (examples of the organic light absorbing materials or organic transparent materials include aromatic monocyclic compounds, aromatic condensed cyclic compounds, hetero monocyclic compounds, condensed heterocycle compounds, polymethine compounds, π-conjugated low molecular compounds, carbonium compounds, styryl-based compounds, stilbene-based compounds, metal complex-based compounds, π-conjugated high molecular compounds, σ-conjugated compounds, pigment-containing polymeric compounds, and polymer complex-based compounds), materials having a small (shallow) HOMO and LUMO values may be for p-type organic semiconductors, and materials having a large (deep) HOMO and LUMO values may be for n-type organic semiconductors, and a combination of two or more types of materials in which any one type absorbs blue light may be exemplified. Although a thickness of the organic photoelectric conversion layer is not limited, for example, values of $1×10^8$ in to $5×10^{-7}$ m, preferably $2.5×10^8$ m to $3×10^{-7}$ m, more preferably $2.5×10^{-8}$ m to $2×10^{-7}$ m, and even more preferably $1×10^{-7}$ in to $2.5×10^{-7}$ m may be exemplified.

Examples of materials for the organic photoelectric conversion layer 23 included in a green imaging element having the organic photoelectric conversion layer that is sensitive to green and absorbs green light (light having a wavelength of 495 nm to 570 nm) include, in addition to quinacridone or quinacridone derivatives, and thienoacen-based materials represented by the above-described various derivatives, anthracene derivatives, phenanthrene derivatives, pyrene derivatives, perylene derivatives, tetracene derivatives, fluoranthene derivatives, subphthalocyanine derivatives, and metal complexes having heterocyclic compounds as ligands as p-type organic semiconductor materials, and fullerene and fullerene derivatives, organic semiconductor materials having larger (deeper) HOMO and LUMO values than those of p-type organic semiconductors, transparent inorganic metal oxide as n-type organic semiconductor materials. Examples of n-type organic semiconductor materials include, specifically, heterocyclic compounds containing nitrogen atoms, oxygen atoms, and sulfur atoms, for example, organic molecules having pyridine, pyrazine, pyrimidine, triazine, quinoline, quinoxaline, isoquinoline, acridine, phenadine, phenanthroline, tetrazole, pyrazole, imidazole, thiazole, oxazole, imidazole, benzimidazole, benzotriazole, benzoxazole, benzoxazole, carbazole, benzofuran, dibenzofuran and the like in a part of the molecular skeleton, organometallic complexes, and subphthalocyanine derivatives. More specifically, two or more types of materials are extracted from organic light absorbing materials or organic transparent materials (examples of the organic light absorbing materials or organic transparent materials include aromatic monocyclic compounds, aromatic condensed cyclic compounds, hetero monocyclic compounds, condensed heterocycle compounds, polymethine compounds, π-conjugated low molecular compounds, carbonium compounds, styryl-based compounds, stilbene-based compounds, metal complex-based compounds, n-conjugated high molecular compounds, β-conjugated compounds, pigment-containing polymeric compounds, and polymer complex-based compounds), materials having a small (shallow) HOMO and LUMO values may be for p-type organic semiconductor materials, and materials having a large (deep) HOMO and LUMO values may be for n-type organic semiconductor materials, and a combination of two or more types of materials in which any one type absorbs green light may be exemplified. Although a thickness of the organic photoelectric conversion layer is not limited, for example, values of $1×10^{-8}$ m to $5×10^7$ m, preferably $2.5×10^8$ m to $3×10^7$ m, more preferably $2.5×10^8$ m to $2.5×10^7$ m, and even more preferably $1×10^7$ m to $2.5×10^7$ m may be exemplified.

Examples of materials for the organic photoelectric conversion layer 23 included in a red imaging element having the organic photoelectric conversion layer that is sensitive to red and absorbs red light (light having a wavelength of 620 nm to 750 nm) include, in addition to quinacridone or quinacridone derivatives, and thienoacen-based materials represented by the above-described various derivatives, pentacene derivatives, perylene derivatives, fluoranthene derivatives, phthalocyanine derivatives, subphthalocyanine derivatives, and metal complexes having heterocyclic compounds as ligands as p-type organic semiconductor materials, and fullerene and fullerene derivatives, organic semiconductor materials having larger (deeper) HOMO and LUMO values than those of p-type organic semiconductors, transparent inorganic metal oxide as n-type organic semiconductor materials. Examples of n-type organic semiconductor materials include, specifically, heterocyclic compounds containing nitrogen atoms, oxygen atoms, and sulfur atoms, for example, organic molecules having pyridine, pyrazine, pyrimidine, triazine, quinoline, quinoxaline, isoquinoline, acridine, phenadine, phenanthroline, tetrazole, pyrazole, imidazole, thiazole, oxazole, imidazole, benzimidazole, benzotriazole, benzoxazole, benzoxazole, carbazole, benzofuran, dibenzofuran and the like in a part of the molecular skeleton, organometallic complexes and subphthalocyanine derivatives. More specifically, two or more types of materials are extracted from organic light absorbing materials or organic transparent materials (examples of the organic light absorbing materials or organic transparent materials include aromatic monocyclic compounds, aromatic condensed cyclic compounds, hetero monocyclic compounds, condensed heterocycle compounds, polymethine compounds, π-conjugated low molecular compounds, carbonium compounds, styryl-based compounds, stilbene-based compounds, metal complex-based compounds, π-conjugated high molecular compounds, σ-conjugated compounds, pigment-containing polymeric compounds, and polymer complex-based compounds), materials having a small (shallow) HOMO and LUMO values may be for p-type organic semiconductors, and materials having a large (deep) HOMO and LUMO values may be for n-type organic semiconductors, and a combination of two or more types of materials in which any one type absorbs red light may be exemplified. Although a thickness of the organic photoelectric conversion layer is not limited, for example, values of $1\times10^{-8}$ m to $5\times10^{-7}$ m, preferably $2.5\times10^{-8}$ m to $3\times10^{-7}$ m, more preferably $2.5\times10^{-8}$ m to $2.5\times10^{-7}$ m, and even more preferably $1\times10^{-7}$ m to $2.5\times10^{7}$ m may be exemplified.

In the imaging element of Embodiment 1, one of the anode 21 and the cathode 25 is formed of a transparent conductive material and the other is formed of a metal material. Here, since light is incident from the cathode on the imaging elements illustrated in FIG. 1A and FIG. 2B, the cathode 25 may be formed of a transparent conductive material (e.g., ITO), and the anode 21 may be formed of Al—Nd (an alloy of aluminum and neodymium) or ASC (an alloy of aluminum, samarium, and copper). On the other hand, since light is incident from the anode side on the imaging element illustrated in FIG. 1B and FIG. 2A, the anode 21 may be formed of a transparent conductive material (e.g., ITO), and the cathode 25 may be formed of Al (aluminum), Al—Si—Cu (an alloy of aluminum, silicon, and copper), or Mg—Ag (an alloy of magnesium and silver).

Figure 14:
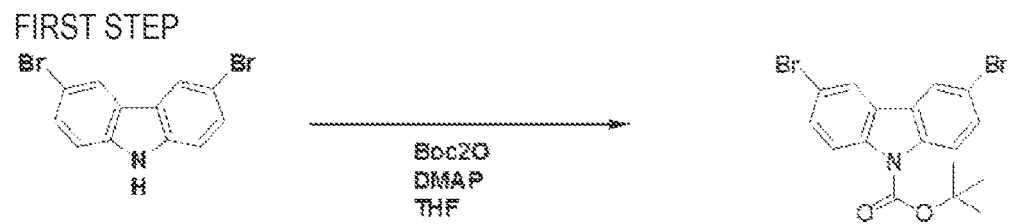
FIG. 14 is a diagram illustrating a synthetic scheme of a material expressed by structural formula (4) forming an anode-side buffer layer.
Figure 14:
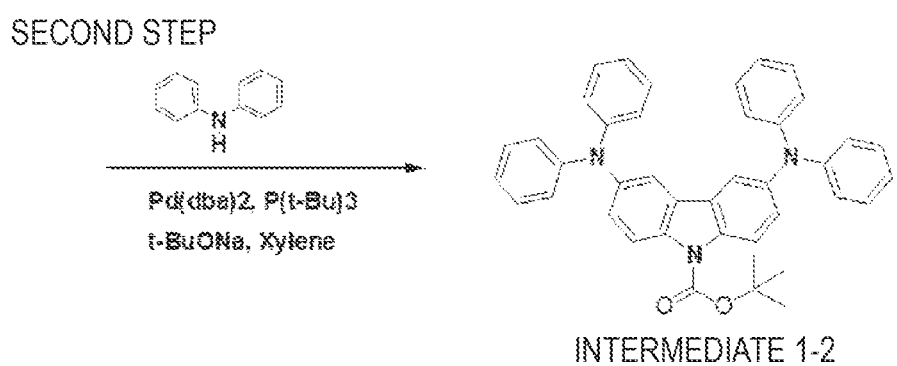
Figure 14:
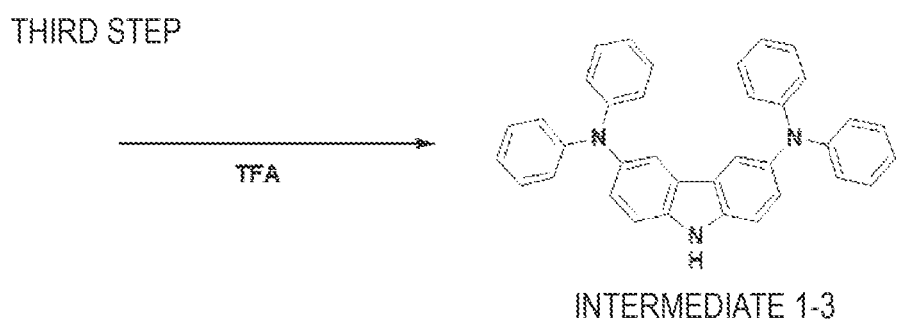
Figure 14:
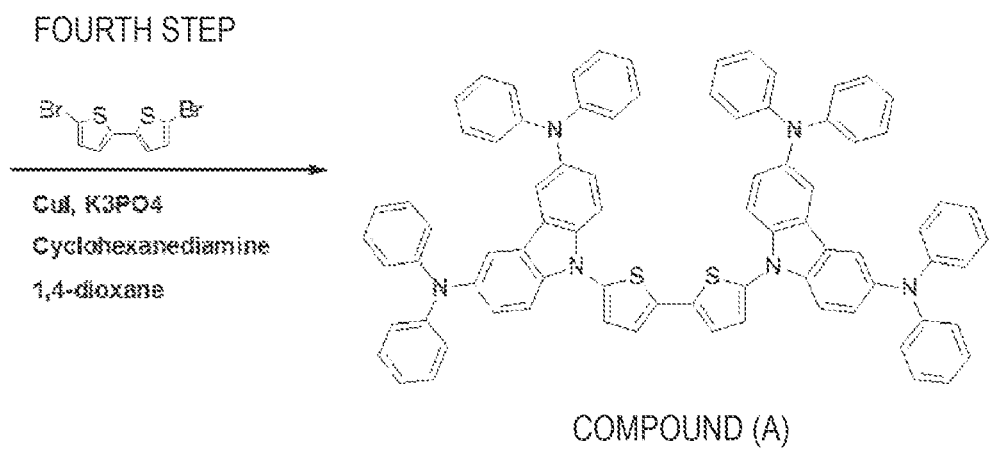

A material expressed by the above-described structural formula (4) [compound (A)] forming the anode-side buffer layer was synthesized on the basis of the synthetic scheme having four steps as illustrated in FIG. 14.

[First Step]

(1) 50.6 grams of (156 millimoles, 1.00 molar equivalent) 3,6-dibromocarbazole, 500 milliliters of THF, and 46.5 grams (213 millimoles, 1.37 molar equivalent) of $(Bo)_2O$ were prepared in an argon-replaced one-liter four-necked flask. Further, "Bo" means a tert-butoxycarbonyl group.

(2) 2.30 grams (18.8 millimoles, 0.12 molar equivalent) of N,N-dimethyl-4-aminopyridine (DMAP) were added thereto little by little.

(3) The mixture was stirred at room temperature for 2 hours.

(4) The reaction solution was poured into 1.5 liters of water and precipitated crystal was filtered.

(5) The obtained crystal was dissolved into 1.5 liters of chloroform then dried using magnesium sulfate and filtered.

(6) 200 milliliters of ethanol was added to the filtrate and it was concentrated under reduced pressure to be 300 milliliters.

(7) The crystal precipitated in the concentrate was filtered.

(8) The filtrate was suspended in 1 liter of isopropyl alcohol, washed, and filtered.

(9) The obtained white crystal was dried at 80° C. for 2 hours under reduced pressure, and thereby 63.7 grams (150 millimoles at a yield of 96.3%) of intermediate 1-1 was obtained. The purity was analyzed by HPLC and found to be 99.7%. As a result of structural analysis by $^1$H NMR, the desired number of protons was obtained and it was possible to identify that it was the intermediate 1-1.

[Second and Third Steps]

Since some protection groups are deprotected when an intermediate 1-2 is synthesized, the third step was continuously performed together and identification was performed after purification. The synthesis order is as follows.

(1) 57.0 grams (134 millimoles, 1 molar equivalent) of the intermediate 1-1, 47.7 grams (282 millimoles, 2.10 molar equivalent) of diphenylamine, 2 liters of deoxygenated xylene, and 38.7 grams (402 millimoles, 3.00 molar equivalent) of NaOtBu were prepared in an argon-replaced four-liter four-necked flask.

(2) Bubbling was performed thereon using argon gas for 30 minutes.

(3) 20.0 milliliters (6.70 millimoles, 0.05 molar equivalent) of 10% P $(tBu)_3$ hexane solution and 2.85 grams (4.96 millimoles, 0.04 molar equivalent) of Pd $(dBa)_2$ were added thereto.

(4) The temperature was increased to 107° C. and the mixture was stirred for one hour.

(5) After cooling, the reaction solution was added to 500 milliliters of water and separated.

(6) The water layer obtained in (5) was extracted twice using 500 milliliters of toluene.

(7) The organic layers obtained in (5) and (6) were combined and dried using magnesium sulfate.

(8) After filtration, the filtered solution was concentrated under reduced pressure to be about 1.5 liters.

(9) 131 milliliters (1.70 millimoles, 12.7 molar equivalent) of trifluoroacetic acid were added to the concentrated solution and it was stirred at 90° C. for one hour.

(10) After cooling, the reaction solution was poured into a sodium carbonate aqueous solution to make it alkaline and separated.

(11) After the organic layer was cleansed using water, it was dried using magnesium sulfate and filtered.

(12) The filtrate was filtered through Florisil filtration (Florisil: 500 grams with toluene as a solvent).

(13) The filtrate was concentrated to dryness.

(14) Chloroform was added to the residue to be dissolved, and 500 milliliters of methanol were added thereto.

(15) The mixture was concentrated under reduced pressure to be about 500 milliliters, and precipitated crystal was filtered.

(16) 38.4 grams (76.6 millimoles at a yield of 57.1%) of an intermediate 1-3 of brown crystal coarse bodies could be obtained.

(17) The crystal obtained in (16) was dispersed in 300 milliliters of toluene and refluxed for one hour.

(18) The mixture was cooled up to 40° C. and then filtered.

(19) The obtained crystal was dried at 60° C. under reduced pressure for two hours, and thereby 25.1 grams (50.0 millimoles at an overall yield of 37.3% from the second step to the third step) of a light yellow crystal compound 1-3 were obtained. The intermediate 1-3 could be identified through structural analysis by $^1$H NMR and MALDI-TOF-MS.

[Fourth Step]

(1) 6.16 grams (19.0 millimoles, 1.00 molar equivalent) of 5,5'-dibromo-2,2'-bithiophene, 20.0 grams (399.9 millimoles, 2.10 molar equivalent) of the intermediate 1-3, 31.4 grams (148 millimoles, 7.79 molar equivalent) of tripotassium phosphate, and 120 milliliters of dehydrated 1,4-dioxane were prepared in an argon-replaced Schlenk tube.

(2) Bubbling was performed thereon using argon gas for 30 minutes.

(3) 0.70 milliliters (5.84 millimoles, 0.31 molar equivalent) of trans-1,2-cyclohexanediamine and 745 milligrams (3.91 millimoles, 0.21 molar equivalent) of CuI were added thereto.

(4) The mixture was stirred overnight with heating under reflux.

(5) Since an intermediate remained, 0.50 milliliters (4.17 millimoles, 0.22 molar equivalent) of trans-1,2-cyclohexanediamine and 378 milligrams (1.98 millimoles, 0.10 molar equivalent) of CuI were added thereto.

(6) The mixture was stirred overnight with heating under reflux.

(7) Since an intermediate remained in a very small amount, 0.50 milliliters (4.17 millimoles, 0.22 molar equivalent) of trans-1,2-cyclohexanediamine and 130 milligrams (0.68 millimoles, 0.04 molar equivalent) of CuI were added thereto and refluxed, but the change was small, and thus heating was finished.

(8) After cooling, the reaction solution was poured in to water.

(9) Since an oily substance and a solid were mixed, ultrasonic waves were applied thereto for 15 minutes to disperse crystals and they were filtered.

(10) The obtained crystal was taken out and suspended and cleansed in 200 milliliters of acetonitrile, and then filtered.

(11) 40.5 grams of the obtained brown crystal were dried at 80° C. under reduced pressure for one hour.

(12) 23.6 grams of crystal were dissolved in toluene and filtered using activated clay (100 grams) and silica gel (200 grams of PSQ).

(13) The yellow filtrate was concentrated under reduced pressure to be about 50 milliliters, heptane was added thereto, and the precipitated crystal was filtered.

(14) After the crystal was dried under reduced pressure, 16.3 grams (14.0 millimoles) of the compound (A) which is yellow crystal were obtained.

(15) Soxhlet extraction was performed on the coarse bodies of the compound (A) obtained in (14) twice to purify them.

(16) The compound was dried at 80° C. under reduced pressure for one hour, and thereby 7.70 grams (6.61 millimoles at an extraction yield of 79.1%) of the compound (A) were obtained. As a result of purity analysis using HPLC after that, the purity of 97.1% was confirmed.

Sublimation purification was performed on the compound (A) that had undergone Soxhlet extraction twice. Specifically, the following operations were performed.

(1) 2.00 grams of the compound (A) was prepared in the raw material part of a sublimation purification device.

(2) After pressure inside the sublimation tube was reduced to $7.2 \times 10^{-4}$ Pa, sublimation purification was performed.

(3) After sublimation was finished, the compound (A) precipitated in the collection tube was recovered. The recovered amount was 1.29 grams (sublimation recovery rate of 64.3%).

Figure 15:
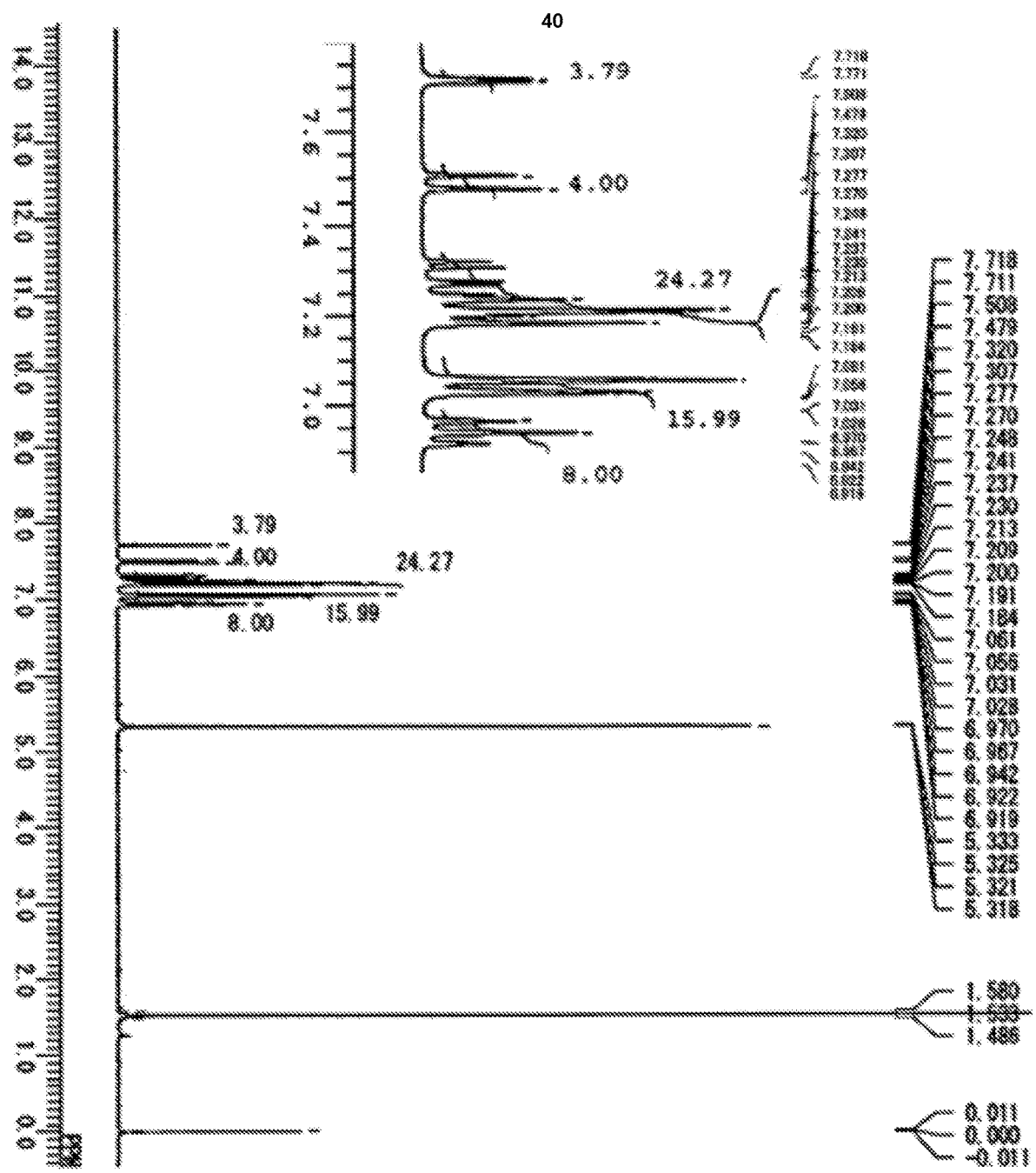
FIG. 15 is a chart showing the analysis result of $^1$H NMR of a compound (A).
Figure 16:
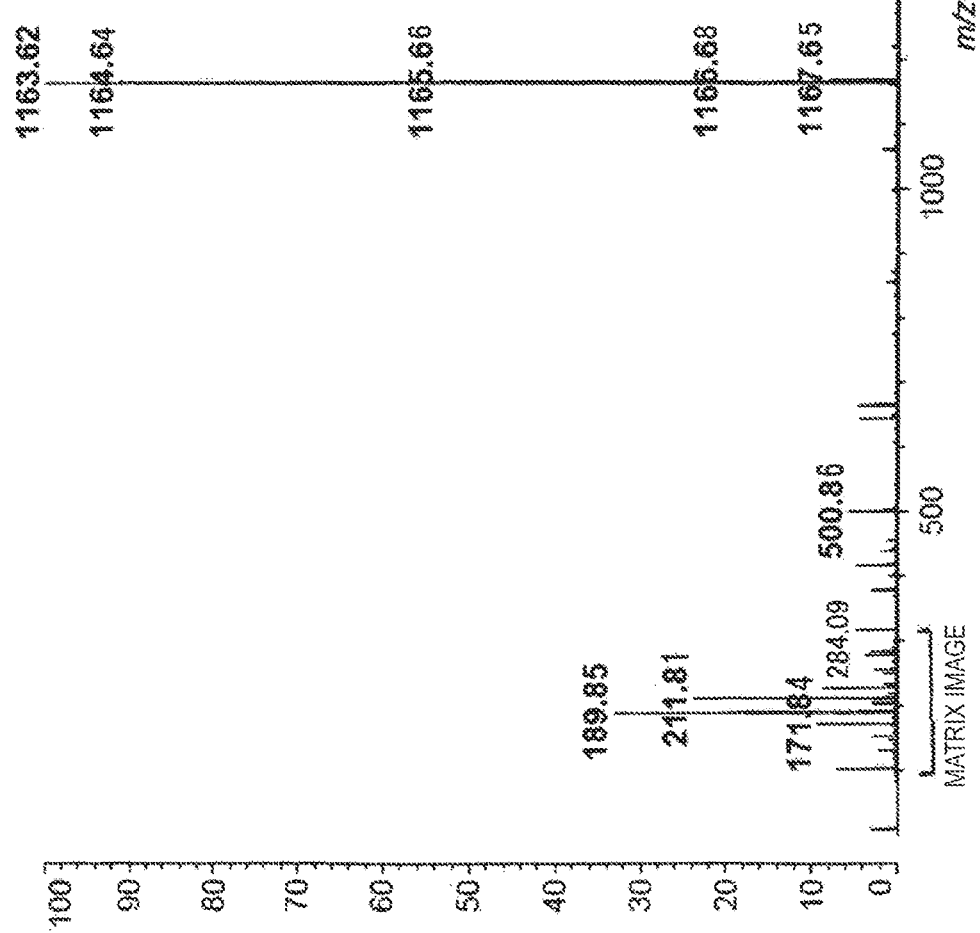
FIG. 16 is a chart showing the MALDI-TOF-MS analysis result of the compound (A).

(4) Purity analysis was performed on the compound (A) that had undergone sublimation purification using HPLC, the purity of 99.1% was confirmed. In addition, the substance was identified as the compound (A) through structural analysis by $^1$H NMR and mass spectrometry using MALDI-TOF-MS. The analysis result of $^1$H NMR is shown in FIG. 15 and the analysis result of MALDI-TOF-MS is shown in FIG. 16.

The material [compound (B)] having the above-described structural formula (5) was obtained on the basis of the same synthesis scheme as that of the compound (A) illustrated in FIG. 14, however, by using p,p'-ditolylamine in place of diphenylamine as the compound reacted to the intermediate 1-1 in (I) of the second step.

An imaging element for evaluation was produced in the following method as indicated in the schematic partial sectional view of FIG. 3A. Further, the imaging element for evaluation was set as a green imaging element.

An ITO film having a thickness of 120 nm was formed on the substrate 20 formed of a quartz substrate using a sputtering device, and the anode 21 formed of the ITO film was formed using a photolithography and etching techniques. Next, the insulating layer 31 was formed on the substrate 20 and the anode 21, then the insulating layer 31 was patterned using the photolithography and etching techniques, the anode 21 in a size of 1 mm square was exposed, and then ultrasonic cleansing was performed thereon using a detergent, acetone, and ethanol. Then, after the substrate was dried, UV/ozone treatment was further performed thereon for 10 minutes. Next, the substrate 20 was fixed to a substrate holder of a vacuum deposition device, and pressure of the deposition tank was reduced to $5.5 \times 10^{-5}$ Pa.

After that, the anode-side buffer layer having a thickness of 10 nm formed of a material having the above-described structural formula (4) or structural formula (5) was formed on the basis of the vacuum deposition method using a shadow mask. Next, 2Ph-BTBT which is a p-type semiconductor material expressed in the following structural formula (11), fluorinated subphthalocyanine chloride (F6-SubPc-Cl) that functions as a pigment material expressed in the following structural formula (12), and C60 which is an n-type semiconductor material as shown below were co-deposited on the anode-side buffer layer at a deposition speed ratio of 4:4:2 to have a thickness of 230 nm, and the photoelectric conversion layer 23 formed of a mixed layer of the p-type organic semiconductor material and the n-type organic semiconductor material (bulk heterostructure) was obtained. Continuously, B4PyMPM (see the following structural formula (13)) was deposited to be 5 nm, and thereby the cathode-side buffer layer 24 was obtained. After that, it was put into a container with an inert gas atmosphere and loaded into a sputtering device, a film of ITO was formed on the cathode-side buffer layer 24 to have a thickness of 50 nm, and thereby the cathode 25 was obtained. After that, processes in a case in which an actual imaging element and imaging apparatus were formed, particularly, formation of color filters, formation of a protective film, and thermal treatment assuming a heating process such as soldering for the imaging element at 150° C. for 2.5 hours were performed in a nitrogen atmosphere, and thereby an imaging element for evaluation of Embodiment 1A as illustrated in the schematic partial sectional views of FIG. 3A and FIG. 1A was obtained. Alternatively, after the cathode-side buffer layer 24 was formed, the cathode 25 formed of an aluminum (Al) layer having a thickness of 100 nm was obtained in the same vacuum deposition device. After that, processes in the case in which an actual imaging element and imaging apparatus were formed, particularly, formation of color filters, formation of a protective film, and thermal treatment assuming a heating process such as soldering for the imaging element at 150° C. for 2.5 hours were performed in a nitrogen atmosphere, and thereby an imaging element for evaluation of Embodiment 1B as illustrated in the schematic partial sectional views of FIG. 3A and FIG. 2A was obtained.

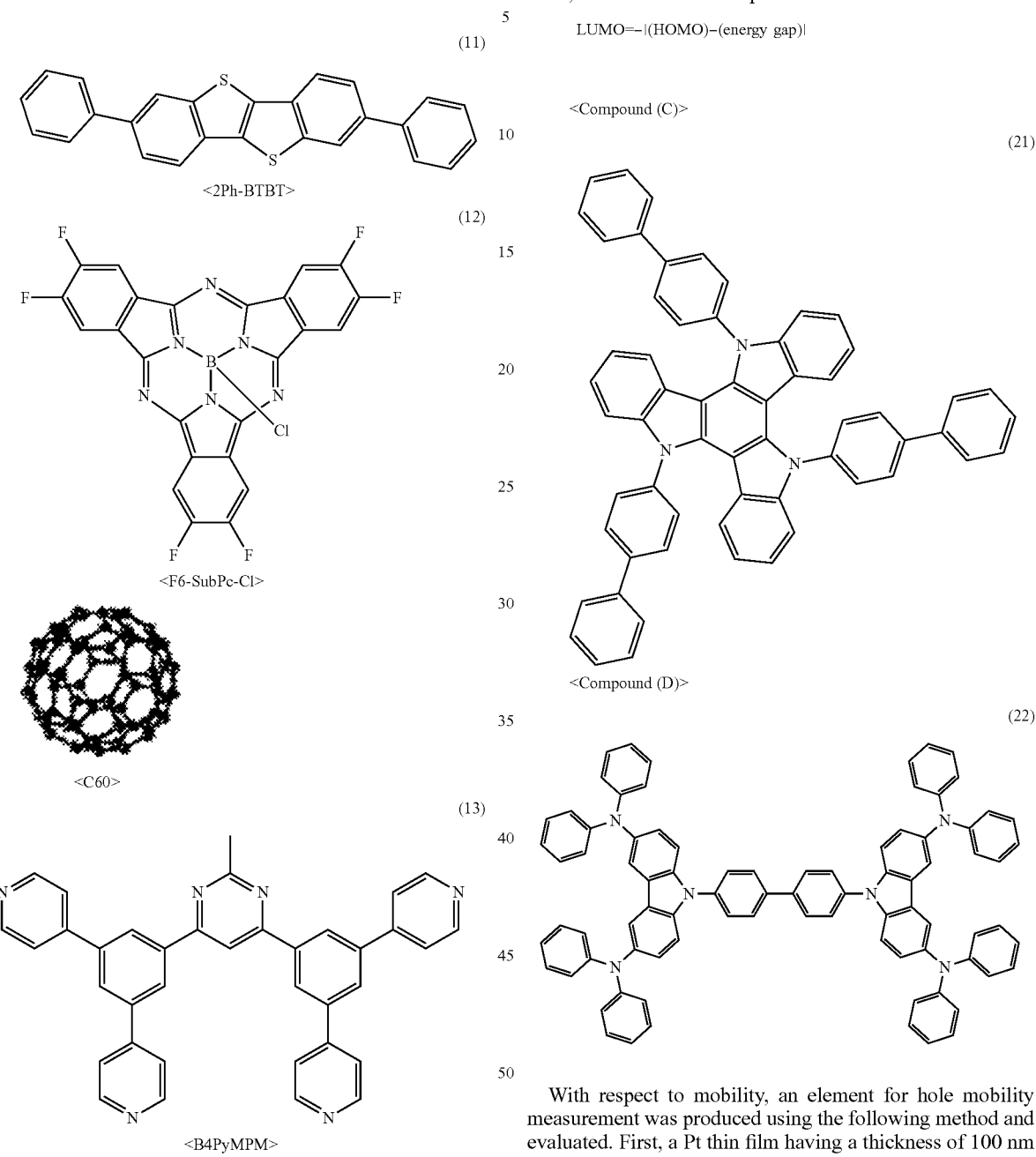

Physical property value evaluation was performed on the material used in the anode-side buffer layer on the basis of the method described below.

That is, in measurement of a HOMO (ionization potential) value, each of films of the compound (A), the compound (B), a compound (C) expressed by the following structural formula (21), and a compound (D) expressed by the following structural formula (22) was formed on an Si substrate to have a thickness of 20 nm, the thin film surfaces thereof were measured using UV photoelectron spectroscopy (UPS), and thereby the HOMO value was obtained. In addition, the optical energy gap was calculated from the absorption edge of the absorption spectrum of the thin film of each material, and the LUMO value was calculated from the difference between the HOMO value and the energy gap. Here, the value can be expressed as follows.

$$LUMO=-|(HOMO)-(\text{energy gap})|$$

Figure 17:
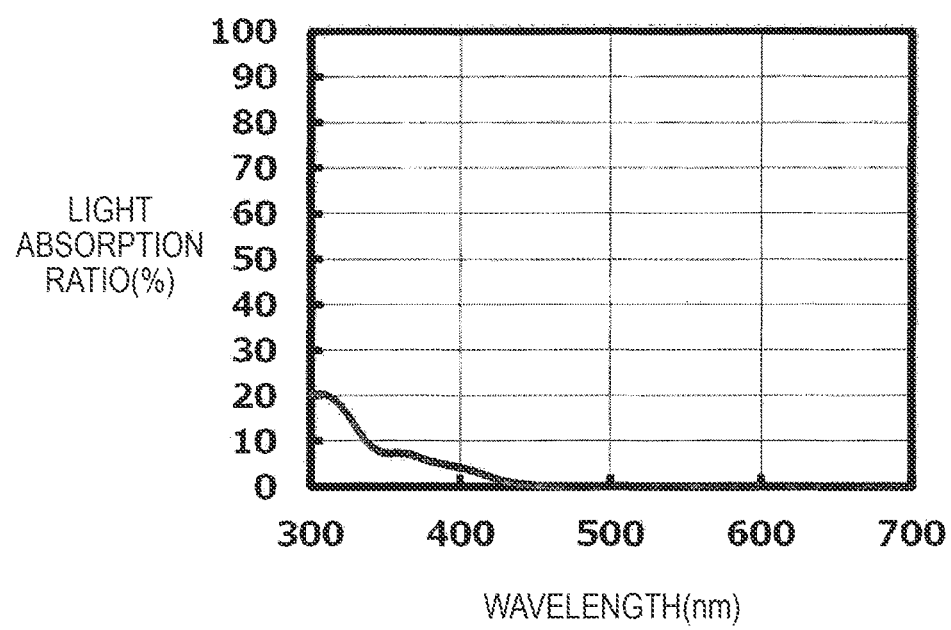
FIG. 17 is a graph showing the absorption spectrum in a case in which the compound (A) is deposited on a quartz substrate to a thickness of 50 nm and is converted to a thickness of 10 nm.

With respect to mobility, an element for hole mobility measurement was produced using the following method and evaluated. First, a Pt thin film having a thickness of 100 nm was formed using an EB deposition method, and an anode formed of Pt was formed on the basis of the lithography technique using a photomask. Next, an insulating layer was formed on a substrate and the anode, the anode in a size of 0.25 mm square was exposed using the lithography technique, and a film of molybdenum oxide ($MoO_3$) having a thickness of 1 nm, a thin film formed of the compound (A), the compound (B), the compound (C), and the compound (D) having a thickness of 200 nm for measuring hole mobility, a film of molybdenum oxide ($MoO_3$) having a thickness of 3 nm, and a cathode formed of Au having a thickness of 100 nm were formed thereon using a deposition method. Then, voltage from −1 V to −20 V or +1 V to +20 V were applied to the element for mobility film formation obtained as described above, a formula of a space charge limited current (SCLC) was fitted to a current-voltage curve by which a current flowed by the negative bias or positive bias, and hole mobility at −1 V or +1 V was measured. The HOMO values, LUMO values, and mobility of the compound (A), compound (B), compound (C), and compound (D) measured as described above are shown in Tables 1 and 2. In addition, the compound (A) was deposited to form a film on a quartz substrate to a thickness of 50 nm, and the absorption spectrum in a case in which the thickness is converted to the thickness of 10 nm is shown in FIG. 17. In a case in which an absorption maximum of the compound (A) appears at a wavelength of 400 nm or lower and is used in the anode-side buffer layer, the compound absorbs a small amount of visible light and has spectral characteristics of not disturbing photoelectric conversion of incident light on a layer positioned on the cathode side rather than the anode-side buffer layer. In addition, spectral characteristics of the compound (A) are favorable in comparison to general organic semiconductor materials.

Evaluation of the imaging element was performed on the basis of the method described below.

That is, the imaging element was placed on a prober stage of which the temperature was controlled at 60° C., while a voltage of −2.6 V (so-called reverse-biased voltage 2.6 V) was applied between the cathode and the anode, light irradiation was performed under conditions of a wavelength of 560 nm and 2 μM/cm², and thereby the light current was measured. After that, the light irradiation was stopped and the dark current was measured. Next, an external quantum efficiency EQE was obtained from the light current and dark current using the following formula. Further, "1240" is a constant, and "560" is the wavelength of the irradiated light.

$$EQE=|((\text{light current}-\text{dark current})\times 100/(2\times 10^{-6}))\times (1240/560)\times 100|$$

In addition, in evaluation for afterimages, while a voltage of −2.6 V was applied between the cathode and the anode, light irradiation was performed under conditions of a wavelength of 560 nm and 2 μW/cm², then when the light irradiation was stopped, To when the amount of current flowing between the cathode and the anode immediately before the stop of the light irradiation was set to $I_0$ and the time taken until the amount of current became (0.03×$I_0$) after the stop of the light irradiation was set to $T_0$, was set as an afterimage time. Table 1 shows values of external quantum efficiency, dark current, and afterimage time of the compound (A) and compound (B) relative to those of the compound (C), and Table 2 shows values of external quantum efficiency, dark current, and afterimage time of the compound (A) relative to those of the compound (D). Further, samples according to the above-described Embodiment 1A and Embodiment 1B were produced on the basis of the compound (A). In addition, samples having the same structure as that of Embodiment 1A were produced on the basis of the compound (B) and compound (C), and a sample having the same structure as that of the above-described Embodiment 1B was produced on the basis of the compound (D).

TABLE 1

| | | Compounds | | |
|---|---|---|---|---|
| | | (A) | (B) | (C) |
| HOMO | eV | −05.4 | −05.4 | −05.4 |
| LUMO | eV | −02.5 | −02.6 | −02.1 |
| Hole mobility | ×10⁻⁵ cm²/V/s | 3.7 | 5.0 | 0.55 |

TABLE 1-continued

| | | Compounds | | |
|---|---|---|---|---|
| | | (A) | (B) | (C) |
| External quantum efficiency | Relative value | 1.04 | 1.05 | 1.00 |
| Dark current | Relative value | 0.53 | 0.52 | 1.00 |
| Afterimage time | Relative value | 0.11 | 0.10 | 1.00 |

TABLE 2

| | | Compounds | |
|---|---|---|---|
| | | (A) | (D) |
| HOMO | eV | −5.4 | −5.5 |
| LUMO | eV | −2.5 | −2.4 |
| Hole mobility | ×10⁻⁵cm²/V/s | 3.7 | 0.011 |
| External quantum efficiency | Relative value | 1.02 | 1.00 |
| Dark current | Relative value | 0.73 | 1.00 |
| Afterimage time | Relative value | 0.15 | 1.00 |

As is apparent from Table 1, the external quantum efficiency was 4% to 5% higher, the dark current could be curbed by about half, and the afterimage time could be significantly improved to about 1/10 when the compound (A) or compound (B) was used than when the compound (C) was used as the anode-side buffer layer. In addition, as is apparent from Table 2, the external quantum efficiency was 2% higher, the dark current could be curbed to about 70%, and the afterimage time could be significantly improved to 15% when the compound (A) was used than when the compound (D) was used as the anode-side buffer layer.

However, the above-described patent publication describes that, by satisfying the condition that electron affinity of the electron blocking layer is smaller 1.3 eV or more than the work function of an adjacent electrode and the ionization potential of the electron blocking layer is equivalent to or smaller than the ionization potential of an adjacent photoelectric conversion layer, an organic photoelectric conversion element in which photoelectric conversion efficiency does not decrease without an increase of a dark current even if a voltage is applied from outside can be provided.

Here, since the work function of the anode of Embodiment 1 is −4.8 eV and the LUMO values of the compound (A), compound (B), compound (C), and compound (D) are −2.5 eV, −2.6 eV, −2.1 eV, and −2.4 eV respectively, the condition that the LUMO value is smaller by 1.3 eV or more than the work function of the anode is satisfied for both materials. In addition, since 2Ph-BTBT having the HOMO value of −5.6 eV was used as a p-type material (specifically, a p-type organic semiconductor material) of the photoelectric conversion layer of Embodiment 1 and the HOMO (ionization potential) values of the compound (A), compound (B), compound (C), and compound (D) were −5.4 eV or −5.5 eV, materials of the compound (A), compound (B), compound (C), and compound (D) satisfy all conditions of the above-described patent publication. However, the compound (A) and compound (B) are found to be excellent in the external quantum efficiency and dark current, and particularly have 1-digit improved afterimage time with respect to afterimage characteristics in comparison to the compound (C) or the compound (D), and thus the compound (A) or the compound (B) are found to be a more ideal material for the anode-side buffer layer. Although the reason for the dark current reduced to about half (½) has not been elucidated, the compound (A) and the compound (B) have one-digit or 2-digit higher hole mobility than the compound (C) or the compound (D) as is apparent from Tables 1 and 2, and the property is considered to have contributed to the improvement in the afterimage characteristics. In addition, the height of the hole mobility is considered to be derived from the bithiophene skeleton in the mother skeleton on the basis of the contrast between compound (C) and compound (D). Moreover, by having a carbazole skeleton (i.e., by binding carbazole including nitrogen atoms in a side of the bithiophene skeleton), the difference between the HOMO value of the material forming the anode-side buffer layer and the HOMO value of the p-type material forming the photoelectric conversion layer can be optimized (optimization of the energy level difference). That is, the HOMO value of the anode-side buffer layer can approach, for example, −5.6 eV, and the difference between the HOMO value of the material forming the anode-side buffer layer and the HOMO value of the p-type material forming the photoelectric conversion layer can be set to be in the range of ±0.2 eV. In this manner, by using a derivative of the present disclosure in which thiophene and carbazole are combined for the anode-side buffer layer, dark current characteristics and afterimage characteristics which are problems to be solved for practical applications of organic imaging elements in addition to external quantum efficiency can be significantly improved. Further, since spectral characteristics of oligothiophene deteriorate when the degree of polymerization increases, the proper number of thiophenes to be used for the anode-side buffer layer of an imaging element is 2 or smaller. In addition, there is a problem that the HOMO value of oligothiophene is shallow to around −5.2 eV.

FIG. 4 shows a conceptual diagram of an imaging apparatus of Embodiment 1. The imaging apparatus 100 of Embodiment 1 is formed of an imaging area 111 in which the imaging elements 101 described above are arranged in a two-dimensional array on a semiconductor substrate (a silicon semiconductor substrate, for example), a vertical drive circuit 112 as a drive circuit (peripheral circuit), a column signal processing circuit 113, a horizontal drive circuit 114, an output circuit 115, a drive control circuit 116, etc. These circuits may be formed by well-known circuits, and moreover, may be formed by using other circuit configurations (e.g., various circuits used in a conventional CCD imaging apparatus or CMOS imaging apparatus). Further, in FIG. 4, the reference number "101" of the stacked-type imaging element 101 is only shown in one row.

The drive control circuit 116 generates a clock signal and a control signal which are the basis of the operations of the vertical drive circuit 112, the column signal processing circuit 113, and the horizontal drive circuit 114 based on a vertical synchronization signal, a horizontal synchronization signal, and a master clock. Further, the generated clock signal and control signal are input to the vertical drive circuit 112, the column signal processing circuit 113, and the horizontal drive circuit 114.

The vertical drive circuit 112 is formed of, for example, a shift register, and selectively scans each imaging element 101 in the imaging area 111 in the vertical direction in units of rows. Further, a pixel signal (image signal) based on the current (signal) generated according to the amount of light received by each imaging element 101 is sent to the column signal processing circuit 113 via the vertical signal lines 117.

For example, the column signal processing circuit 113 is arranged for each column of the imaging element 101, and signal processing for noise removal and signal amplification is performed on image signal output from the imaging element 101 for one row in each imaging element 101 by a signal from a black reference pixel (not shown, but formed around the effective pixel area). A horizontal selection switch (not shown) is provided in the output stage of the column signal processing circuit 113 so as to be connected to the horizontal signal line 118.

The horizontal drive circuit 114 is formed of, for example, a shift register, and sequentially selects each of the column signal processing circuits 113 by sequentially outputting horizontal scanning pulses, and outputs signals from each of the column signal processing circuits 113 to the horizontal signal line 118.

The output circuit 115 is output by performing signal processing on the signals sequentially supplied from each of the column signal processing circuits 113 via the horizontal signal line 118.

Here, since the organic photoelectric conversion layer itself functions as a color filter, color separation can be performed without disposing a color filter.

Embodiment 2

Although Embodiment 2 is a modification of the imaging element of Embodiment 1, it relates to the stacked-type imaging element of the present disclosure and the imaging apparatus according to the second aspect of the present disclosure. That is, the stacked-type imaging element of Embodiment 2 (an imaging element with vertical spectroscopy) is formed by stacking at least one imaging element described in Embodiment 1. In addition, the imaging apparatus of Embodiment 2 has a plurality of such stacked-type imaging elements. Specifically, the stacked-type imaging elements of Embodiment 2 has a configuration in which three imaging elements (three subpixels) including a blue imaging element, a green imaging element, and a red imaging element described in Embodiment 1 are stacked in the vertical direction as illustrated in the conceptual diagram of FIG. 5A. That is, the stacked-type imaging element having a structure in which subpixels are stacked to form one pixel can be obtained. The blue imaging element is positioned on the uppermost layer, the green imaging element is positioned in the middle, and the red imaging element is positioned in the lowermost layer. However, a stacking order is not limited thereto.

Alternatively, by providing the imaging elements described in Embodiment 1 (a blue imaging element and a green imaging element in the illustrated example) on a silicon semiconductor substrate and one or more imaging elements (imaging elements sensitive to red in the illustrate example) inside the silicon semiconductor substrate positioned below the aforementioned imaging elements as are illustrated in the conceptual diagram of FIG. 5B, a stacked-type imaging element having the structure in which the imaging elements are stacked, that is, the structure in which subpixels are stacked to form one pixel, can be obtained. Further, although the imaging elements formed on the silicon semiconductor substrate are preferable for back surface illuminated type, they are preferable for front surface illuminated type as well. Instead of providing the photoelectric conversion layer inside the silicon semiconductor substrate, the imaging element can also be formed on the semiconductor substrate using an epitaxial growth method, or formed on a silicon layer having a so-called SOI structure.

Further, in order not to disturb light reception of the imaging element positioned at the lower part in the stacked-type imaging element of Embodiment 2, an anode may be formed of, for example, a transparent conductive material, for example, ITO, and a cathode may also be formed of a transparent conductive material, for example, ITO in the imaging elements positioned at the upper part.

In the imaging apparatus of Embodiment 2 having the stacked-type imaging elements, separation of light such as blue, green, and red is not performed using color filters, and imaging elements having sensitive to light with different wavelengths are stacked in the light incidence direction within the same pixel. Therefore, sensitivity and a pixel density per unit volume can be improved. In addition, since organic materials have high absorption coefficients, a film thickness of the organic photoelectric conversion layer can be more thinned than a Si-based photoelectric conversion layer of the related art, and light leakage from an adjacent pixel and limitation on the light incidence angle can be alleviated. Furthermore, although a false color may be generated in a Si-based imaging element of the related art since a color signal is produced by performing an interpolation process between three pixels, occurrence of false colors is curbed in the imaging apparatus of Embodiment 2 having such stacked-type imaging elements.

Embodiment 3

Figure 6:
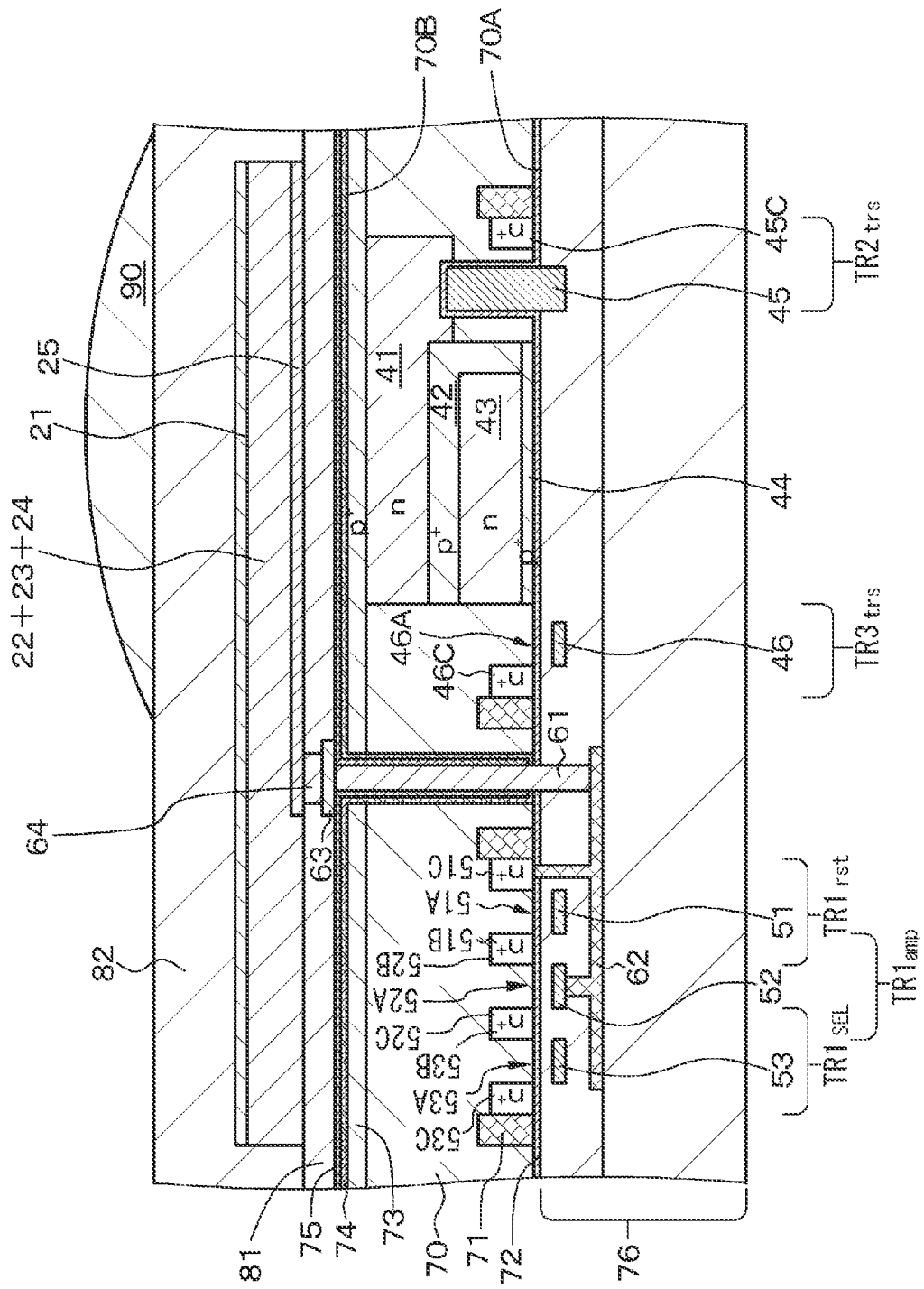
FIG. 6 is a schematic partial sectional view of an imaging element and a stacked-type imaging element of Embodiment 3.
Figure 7:
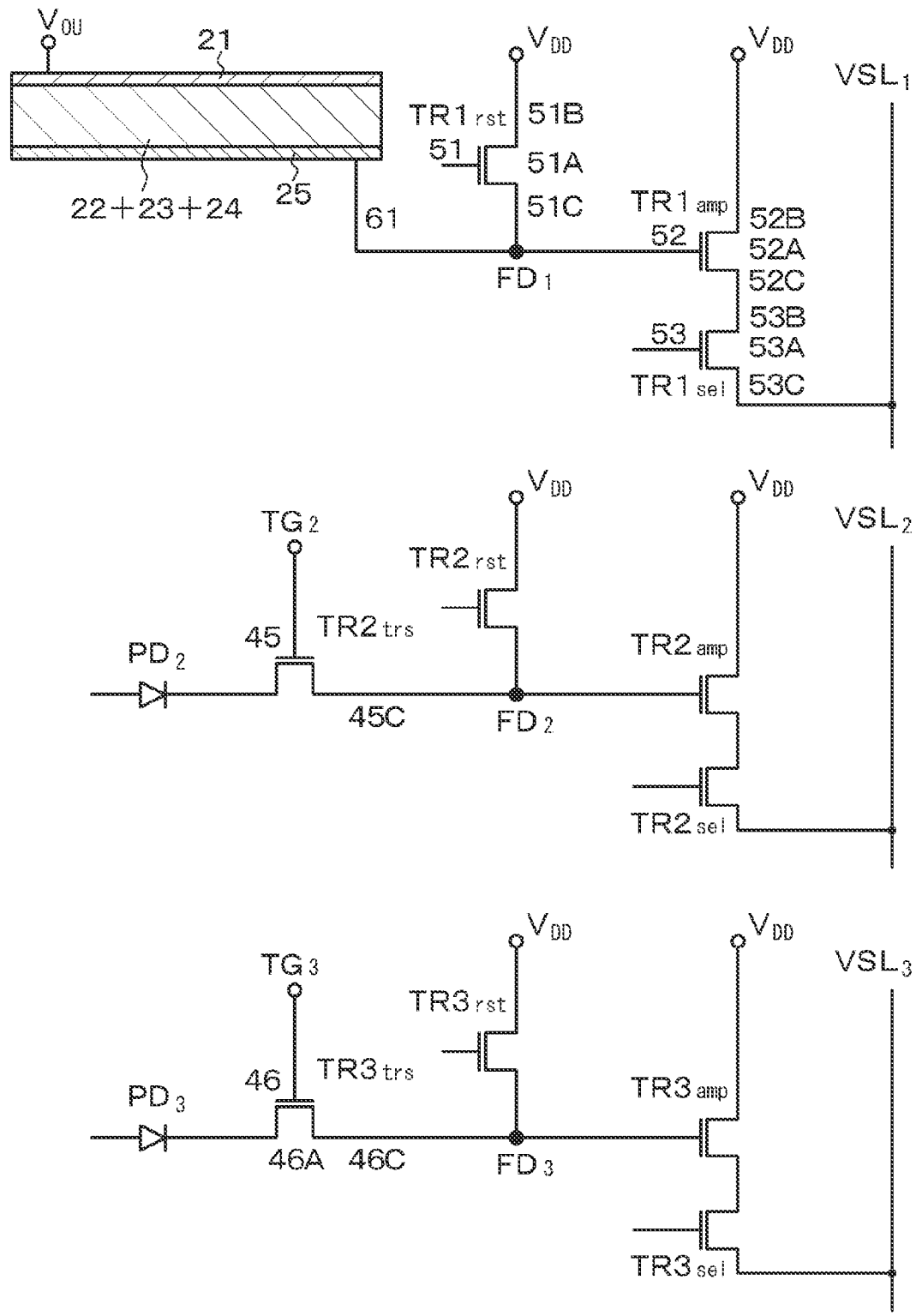
FIG. 7 is an equivalent circuit diagram of the imaging element and the stacked-type imaging element of Embodiment 3.

Embodiment 3 is a modification of Embodiment 1 and Embodiment 2. A more specific schematic partial sectional view of an imaging element and a stacked-type imaging element of Embodiment 3 is illustrated in FIG. 6, and an equivalent circuit diagram of the imaging element and the stacked-type imaging element Embodiment 3 is illustrated in FIG. 7. In Embodiment 3, a semiconductor substrate (more specifically, a silicon semiconductor layer) 70 is provided, and a photoelectric conversion unit is disposed on the semiconductor substrate 70. In addition, a control unit provided in the semiconductor substrate 70 having a drive circuit connected to a cathode 25 is included. Here, the light incidence surface of the semiconductor substrate 70 is assumed to be an upper part and the opposite side of the semiconductor substrate 70 to the light incidence surface is assumed to be a lower part. A wiring layer 62 formed of a plurality of wires is provided at the lower part of the semiconductor substrate 70. In addition, at least a floating diffusion layer $FD_1$ and an amplification transistor $TR1_{amp}$ constituting the control unit are provided on the semiconductor substrate 70, and the cathode 25 is connected to the gate part of the floating diffusion layer $FD_1$ and an amplification transistor $TR1_{amp}$. A reset transistor $TR1_{rst}$ and a select transistor $TR1_{sel}$ constituting the control unit are further provided on the semiconductor substrate 70. In addition, the floating diffusion layer $FD_1$ is connected to one of the source and drain regions of the reset transistor $TR1_{rst}$, one of the source and drain regions of the amplification transistor $TR1_{amp}$ is connected to one of the source and drain regions of the select transistor $TR1_{sel}$, and the other of the source and drain regions of the select transistor $TR1_{sel}$ is connected to a signal line $VSL_1$. These amplification transistor $TR1_{amp}$, reset transistor $TR1_{rst}$, and select transistor $TR1_{sel}$ constitute the drive circuit.

Specifically, the imaging element and stacked-type imaging element of Embodiment 3 are back surface illuminated type imaging element and stacked-type imaging element, and have a structure in which a first-type green imaging element of Embodiment t (hereinafter, referred to as "first imaging element") having a first-type green photoelectric conversion layer which absorbs green light and having sensitivity to green, a second-type conventional blue imaging element (hereinafter, referred to as "second imaging element") having a second-type photoelectric conversion layer which absorbs blue light and having sensitivity to blue, and a second-type conventional red imaging element (hereinafter, referred to as "third imaging element") having a second-type photoelectric conversion layer which absorbs red light and having sensitivity to red are stacked. Here, the red imaging element (third imaging element) and the blue imaging element (second imaging element) are provided in the semiconductor substrate 70, and the second imaging element is located more closer to the light incident side as compared to the third imaging element. Furthermore, the green imaging element (first imaging element) is provided above the blue imaging element (second imaging element). One pixel is formed by the stacked structure of the first imaging element, the second imaging element, and the third imaging element. No color filter is provided.

In the first imaging element, the cathode 25 is formed on the interlayer insulating layer 81. The cathode-side buffer layer 24, the photoelectric conversion layer 2, and the anode-side buffer layer 22 are formed on the cathode 25, and the anode 21 is formed on the anode-side buffer layer 22. Further, the cathode-side buffer layer 24, the photoelectric conversion layer 23, and the anode-side buffer layer 22 are illustrated as one layer. A protective layer 82 is formed on the entire surface including the anode 21, and an on-chip microlens 90 is provided on the protective layer 82. The cathode 25 and the anode 21 are, for example, transparent electrodes formed of ITO. The photoelectric conversion layer 23 is a layer including a known organic photoelectric conversion material sensitive at least to green (e.g., an organic material such as quinacridone). In addition, the photoelectric conversion layer 23 may further include a material layer appropriate for charge accumulation. That is, a material layer appropriate for charge accumulation may be further formed between the cathode-side buffer layer 24 and the cathode 25. The interlayer insulating layer 81 and the protective layer 82 are formed of a known insulating material (e.g., $SiO_2$ or SiN). The anode-side buffer layer 22, the photoelectric conversion layer 23, and the cathode-side buffer layer 24, and the cathode 25 are connected via a connection hole 64 provided in the interlayer insulating layer 81.

An element separation region 71 is formed on the side of the first surface (front surface) 70A of the semiconductor substrate 70, and an oxide film 72 is formed on the first surface 70A of the semiconductor substrate 70. Moreover, a reset transistor $TR1_{rst}$, an amplification transistor $TR1_{amp}$ and select transistor $TR1_{sel}$ forming the control unit of the first imaging element are provided on the side of the first surface of the semiconductor substrate 70, and a first floating diffusion layer $FD_1$ is further provided.

The reset transistor $TR1_{rst}$ is formed of a gate section 51, a channel forming region 51A and source/drain regions 51B and 51C. The gate section 51 of the reset transistor $TR1_{rst}$ is connected to the reset line $RST_1$, and the source/drain region 51C of one side of the reset transistor $TR1_{rst}$ also functions as the first floating diffusion layer $FD_1$, and the source/drain regions 51B of another side is connected to the power supply $V_{DD}$.

The cathode 25 is connected to a source/drain region 51C (first floating diffusion layer $FD_1$) of one side of the reset transistor $TR1_{rst}$ via a connection hole 64 and a pad portion 63 provided in the interlayer insulating layer 81, a contact hole portion 61 formed in the semiconductor substrate 70 and the interlayer insulating layer 76, and the wiring layer 62 formed in the interlayer insulating layer 76.

The amplification transistor $TR1_{amp}$ is formed of the gate section 52, the channel forming region 52A and the source/drain regions 52B and 52C. The gate section 52 is connected to the cathode 25 and the source/drain region 51C (first floating diffusion layer $FD_1$) of one side of the reset transistor $TR1_{rst}$ through the wiring layer 62. Furthermore, the source/drain region 52B of one side shares a region with the source/drain region 51B of another side forming the reset transistor $TR1_{rst}$, and is connected to power supply $V_{DD}$.

The select transistor $TR1_{sel}$ is formed of the gate section 53, the channel forming region 53A and the source/drain regions 53B and 53C. The gate section 53 is connected to the select line $SEL_1$. Furthermore, the source/drain region 53B of one side shares a region with the source/drain region 52C of another side forming the amplification transistor $TR1_{amp}$, and the source/drain region 53C is connected to the signal line (data output line) $VSL_1$.

The second imaging element includes an n-type semiconductor region 41 provided in the semiconductor substrate 70 as a photoelectric conversion layer. The gate section 45 of the transfer transistor $TR2_{trs}$ formed of the vertical transistor extends to the n-type semiconductor region 41 and is connected to the transfer gate line $TG_2$. Furthermore, a second floating diffusion layer $FD_2$ is provided in a region 45C of the semiconductor substrate 70 near the gate section 45 of the transfer transistor $TR2_{trs}$. Charges stored in the n-type semiconductor region 41 are read out to the second floating diffusion layer $FD_2$ via a transfer channel formed along the gate section 45.

In the second imaging element, the reset transistor $TR2_{trs}$, the amplification transistor $TR2_{amp}$ and the select transistor $TR2_{sel}$ forming the control unit of the second imaging element are further provided on the first surface side of the semiconductor substrate 70.

The reset transistor $TR2_{trs}$ is formed of the gate section, the channel forming region and the source/drain region. The gate section of the reset transistor $TR2_{trs}$ is connected to the reset line $RST_2$, and a source/drain region of one side of the reset transistor $TR2_{trs}$ is connected to the power supply $V_{DD}$, and a source/drain region of another side also functions as a second floating diffusion layer $FD_2$.

The amplification transistor $TR2_{amp}$ is formed of the gate section, the channel forming region and the source/drain region. The gate section is connected to a source/drain region (second floating diffusion layer $FD_2$) of another side of the reset transistor $TR2_{trs}$. Furthermore, a source/drain region of one side shares a region with a source/drain region of one side forming the reset transistor $TR2_{trs}$, and is connected to the power supply $V_{DD}$.

The select transistor $TR2_{sel}$ is formed of the gate section, the channel forming region and the source/drain region. The gate section is connected to the select line $SEL_2$. Furthermore, a source/drain region of one side shares a region with a source/drain region of another side forming the amplification transistor $TR2_{amp}$, and a source/drain region of another side is connected to the signal line (data output line) $VSL_2$.

The third imaging element has an n-type semiconductor region 43 provided in the semiconductor substrate 70 as a photoelectric conversion layer. The gate section 46 of the transfer transistor $TR3_{trs}$ is connected to the transfer gate line $TG_3$. Furthermore, a third floating diffusion layer $FD_3$ is provided in a region 46C of the semiconductor substrate 70 near the gate section 46 of the transfer transistor $TR3_{trs}$. Charges stored in the n-type semiconductor region 43 are read out to the third floating diffusion layer $FD_3$ via a transfer channel 46A formed along the gate section 46.

In the third imaging element, the reset transistor $TR3_{rst}$, the amplification transistor $TR3_{amp}$ and the select transistor $TR3_{sel}$ forming the control unit of the third imaging element are further provided on the first surface side of the semiconductor substrate 70.

The reset transistor $TR3_{rst}$ is formed of the gate section, the channel forming region and the source/drain region. The gate section of the reset transistor $TR3_{rst}$ is connected to the reset line $RST_3$, and a source/drain region of one side of the reset transistor $TR3_{rst}$ is connected to the power supply $V_{DD}$, and a source/drain region of another side also functions as the third floating diffusion layer $FD_3$.

The amplification transistor $TR3_{amp}$ is formed of the gate section, the channel forming region and the source/drain region. The gate section is connected to the source/drain region (third floating diffusion layer $FD_3$) of another side of the reset transistor $TR3_{rst}$. Furthermore, a source/drain region of one side shares a region with a source/drain region of one side forming the reset transistor $TR3_{rst}$, and is connected to the power supply $V_{DD}$.

The select transistor $TR3_{sel}$ is formed of the gate section, the channel forming region and the source/drain region. The gate section is connected to the select line $SEL_3$. Furthermore, a source/drain region of one side shares a region with a source/drain region of another side forming the amplification transistor $TR3_{amp}$, and a source/drain region of another side is connected to the signal line (data output line) $VSL_3$.

Reset lines $RST_1$, $RST_2$ and $RST_3$, select lines $SEL_4$, $SEL_2$ and $SEL_3$, and transfer gate lines $TG_2$ and $TG_3$ are connected to the vertical drive circuit 112 forming the drive circuit, and signal lines (data output lines) $VSL_1$, $VSL_2$ and $VSL_3$ are connected to a column signal processing circuit 113 forming the drive circuit.

A p' layer 44 is provided between the n-type semiconductor region 43 and the surface 70A of the semiconductor substrate 70 to suppress generation of dark current. A p' layer 42 is formed between the n-type semiconductor region 41 and the n-type semiconductor region 43, and a part of the side surface of the n-type semiconductor region 43 is surrounded by the p' layer 42. A p' layer 73 is formed on the side of the back surface 70B of the semiconductor substrate 70, and an $HfO_2$ film 74 and an insulating film 75 are formed in a portion between the p' layer 73 and the semiconductor substrate 70, where the contact hole portion 61 is to be formed. In the interlayer insulating layer 76, wirings are formed over a plurality of layers, but are omitted from illustration.

The $HfO_2$ film 74 is a film having a negative fixed charge, and generation of dark current can be suppressed by providing such a film. Further, instead of the $HfO_2$ film, an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, a europium oxide ($Eu_2O_3$) film, a gadolinium oxide ($Gd_2O_3$) film, a terbium oxide ($TB_2O_3$) film, a dysprosium oxide ($Dy_2O_3$) film, a holmium oxide ($Ho_2O_3$) film, a thulium oxide ($Tm_2O_3$) film, a ytterbium oxide ($YB_2O_3$) film, a lutetium oxide ($Lu_2O_3$) film, a yttrium oxide ($Y_2O_3$) film, a hafnium nitride film, an aluminum nitride film, a hafnium oxynitride film and an aluminum oxynitride film may be used. Examples of the film forming method of these films include a CVD method, a PVD method and an ALD method.

The imaging element and stacked-type imaging element of Embodiment 3 may be manufactured by, for example, the following method. That is, first, an SOT substrate is prepared. Then, a first silicon layer is formed on the surface of the SOI substrate by an epitaxial growth method, and a p' layer 73 and an n-type semiconductor region 41 are formed in the first silicon layer. Next, a second silicon layer is formed on the first silicon layer by an epitaxial growth method, and the element separation region 71, the oxide film 72, the p' layer 42, the n-type semiconductor region 43, and the p' layer 44 are formed on the second silicon layer. Furthermore, various transistors and the like forming the control unit of the imaging element are formed on the second silicon layer, and the wiring layer 62, an interlayer insulating layer 76, and various wirings are further formed thereon, and then the interlayer insulating layer 76 and the supporting substrate (not shown) are bonded to each other. Thereafter, the SOI substrate is removed to expose the first silicon layer. Further, the surface of the second silicon layer corresponds to the surface 70A of the semiconductor substrate 70, and the surface of the first silicon layer corresponds to the back surface 70B of the semiconductor substrate 70. Furthermore, the first silicon layer and the second silicon layer are collectively referred to as the semiconductor substrate 70. Next, an opening for forming the contact hole portion 61 is formed on the side of the back surface 70B of the semiconductor substrate 70, and the $HfO_2$ film 74, the insulating film 75 and the contact hole portion 61 are formed, and the pad portions 63, the interlayer insulating layer 81, the connection holes 64, and the cathode 25 are further formed. Next, the anode-side buffer layer 22, photoelectric conversion layer 23, the cathode-side buffer layer 24, the anode 21, the protective layer 82, and the on-chip microlens 90 are formed. Accordingly, the imaging element and the stacked-type imaging element of Embodiment 3 may be obtained.

Figure 8:
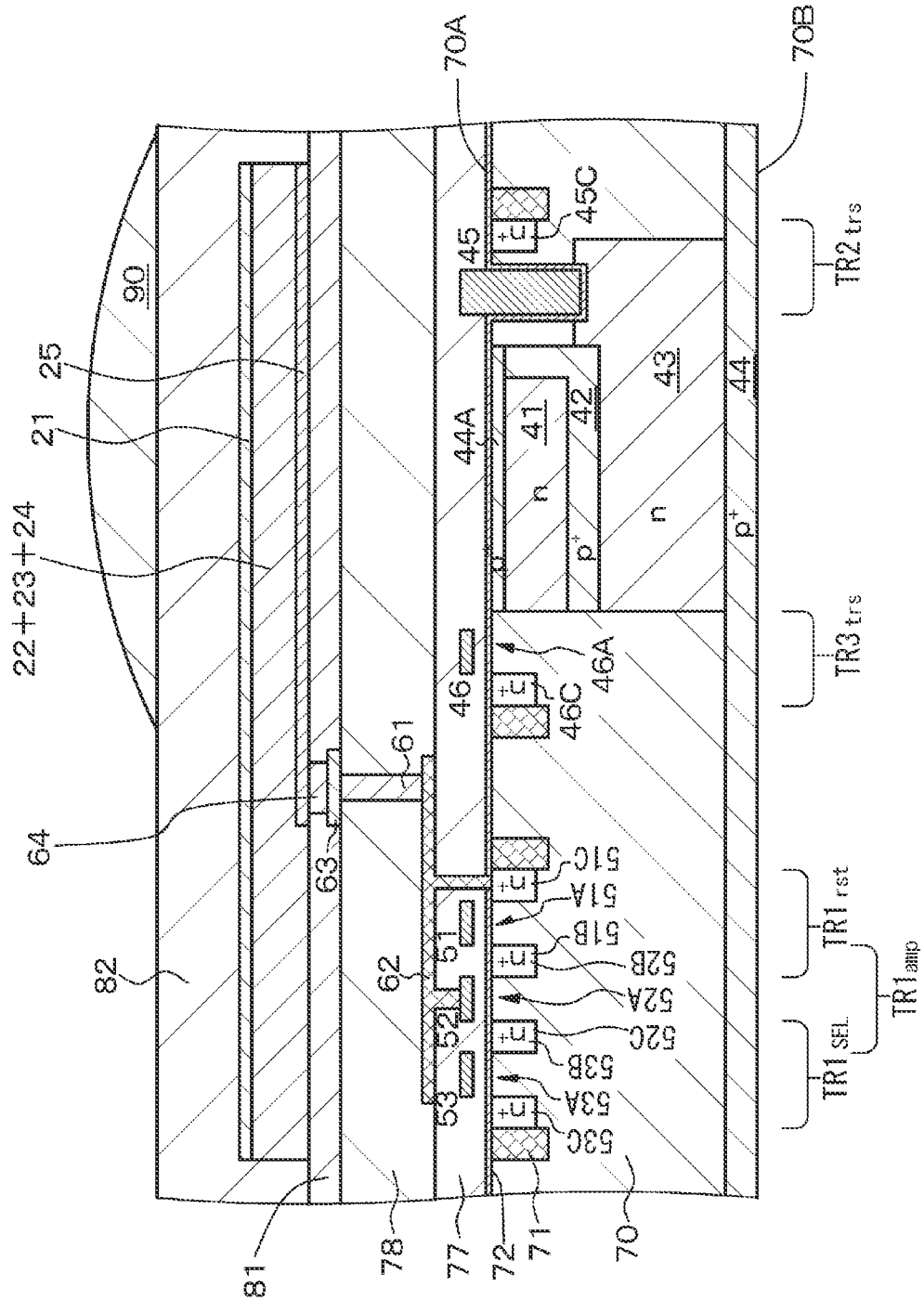
FIG. 8 is a schematic partial sectional view of a modified example of an imaging element (modified example-1) and a stacked-type imaging element of Embodiment 3.

The modified example-1 of the imaging element and stacked-type imaging element of Embodiment 3 schematically shown in FIG. 8 are front surface illuminated type imaging element and stacked-type imaging element, and have a structure in which a first-type green imaging element of Embodiment 1 (first imaging element) having a first-type green photoelectric conversion layer which absorbs green light and having sensitivity to green, a second-type conventional blue imaging element (second imaging element) having a second-type photoelectric conversion layer which absorbs blue light and having sensitivity to blue, and a second-type conventional red imaging element (third imaging element) having a second-type photoelectric conversion layer which absorbs red light and having sensitivity to red are stacked. Here, the red imaging element (third imaging element) and the blue imaging element (second imaging element) are provided in the semiconductor substrate 70, and the second imaging element is located more closer to the light incident side as compared to the third imaging element. Furthermore, the green imaging element (first imaging element) is provided above the blue imaging element (second imaging element).

Various transistors forming the control unit are provided on the surface 70 A of the semiconductor substrate 70. Furthermore, the second imaging element and the third imaging element are provided on the semiconductor substrate 70, and these imaging elements also may have the substantially same configuration and structure of the second imaging element and the third imaging element described above.

The interlayer insulating layers 77 and 78 are formed on the surface 70 A of the semiconductor substrate 70, and the photoelectric conversion unit (the cathode 25, the cathode-side buffer layer 24, the photoelectric conversion layer 23, the anode-side buffer layer 22, and the anode 21) and the like forming the imaging elements are formed on the interlayer insulating layer 78.

As described above, the configuration and structure of the imaging element and the stacked-type imaging element of modified example-1 are the same as those of the imaging element and the stacked-type imaging element of Embodiment 3 except for being the front surface illuminated type imaging element and stacked-type imaging element, and thus detailed description will be omitted.

Figure 9:
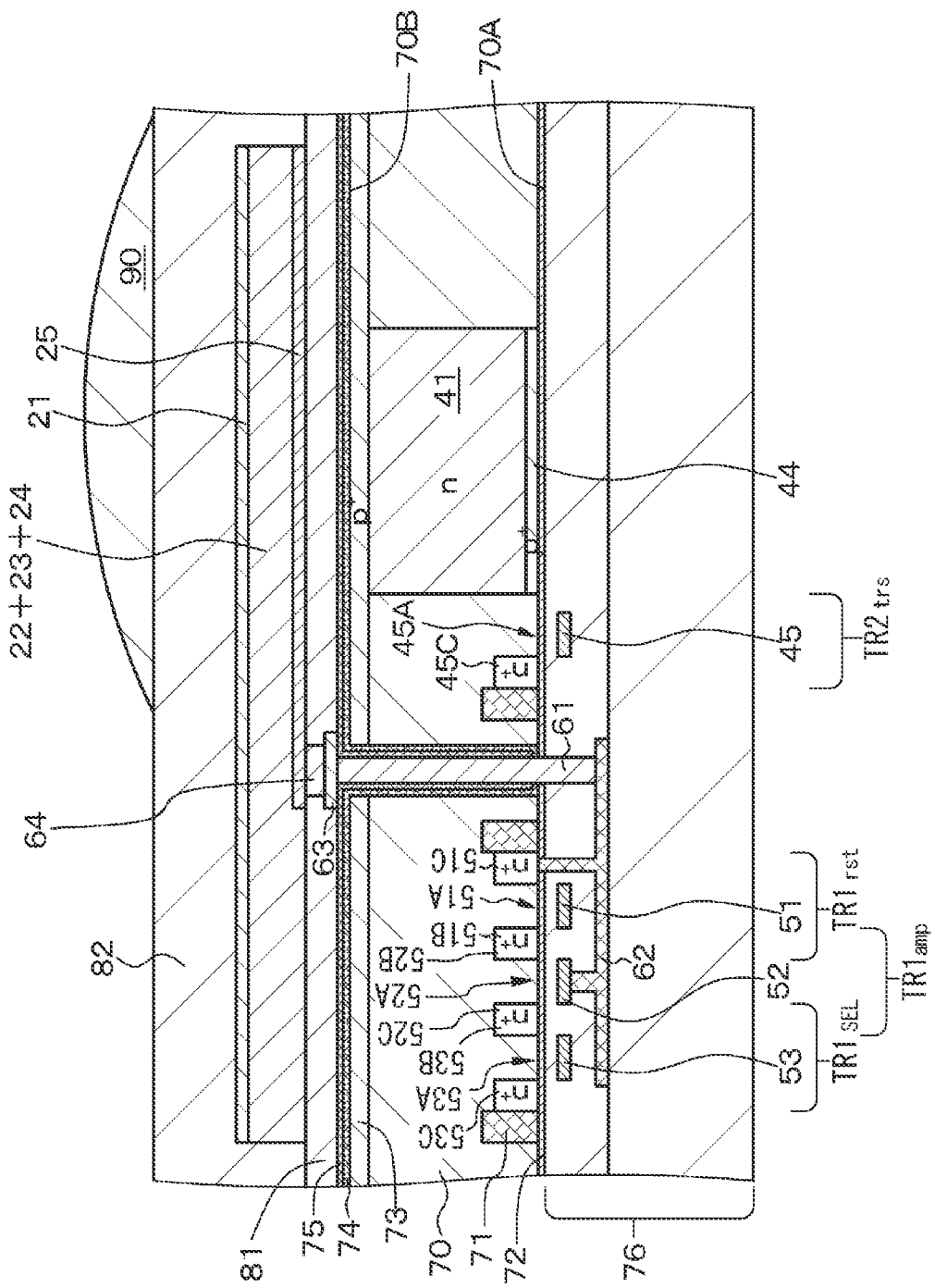
FIG. 9 is a schematic partial sectional view of a modified example of an imaging element (modified example-2) and a stacked-type imaging element of Embodiment 3.
Figure 10:
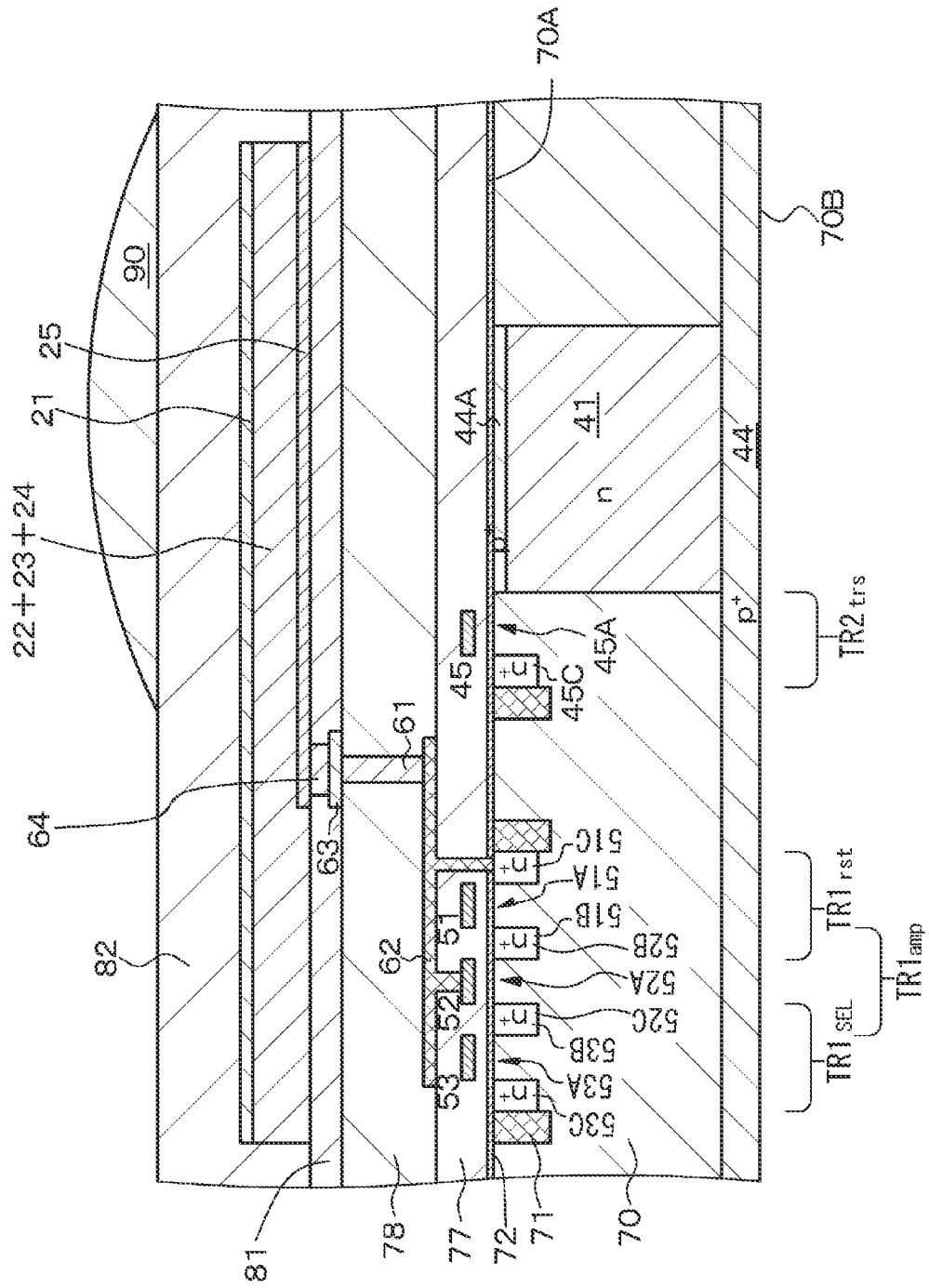
FIG. 10 is a schematic partial sectional view of a modified example of an imaging element (modified example-3) and a stacked-type imaging element of Embodiment 3.

The modified example-2 of the imaging element and stacked-type imaging element of Embodiment 3 schematically shown in FIG. 9 are back surface illuminated type imaging element and stacked-type imaging element, and have a structure in which the first imaging element of the first type of Embodiment 1 and two second imaging elements of the second type are stacked. Further, modified example-3 of the imaging element of Embodiment 3 and stacked-type imaging element of which partial cross sectional views are shown in FIG. 10 are front surface illuminated type imaging element and stacked-type imaging element, and have a structure in which the first imaging element of the first type of Embodiment 1 and two second imaging elements of the second type are stacked. Here, the first imaging element absorbs primary color of light, and the second imaging element absorbs complementary color of light. Alternatively, the first imaging element absorbs white light and the second imaging element absorbs infrared light.

Figure 11:
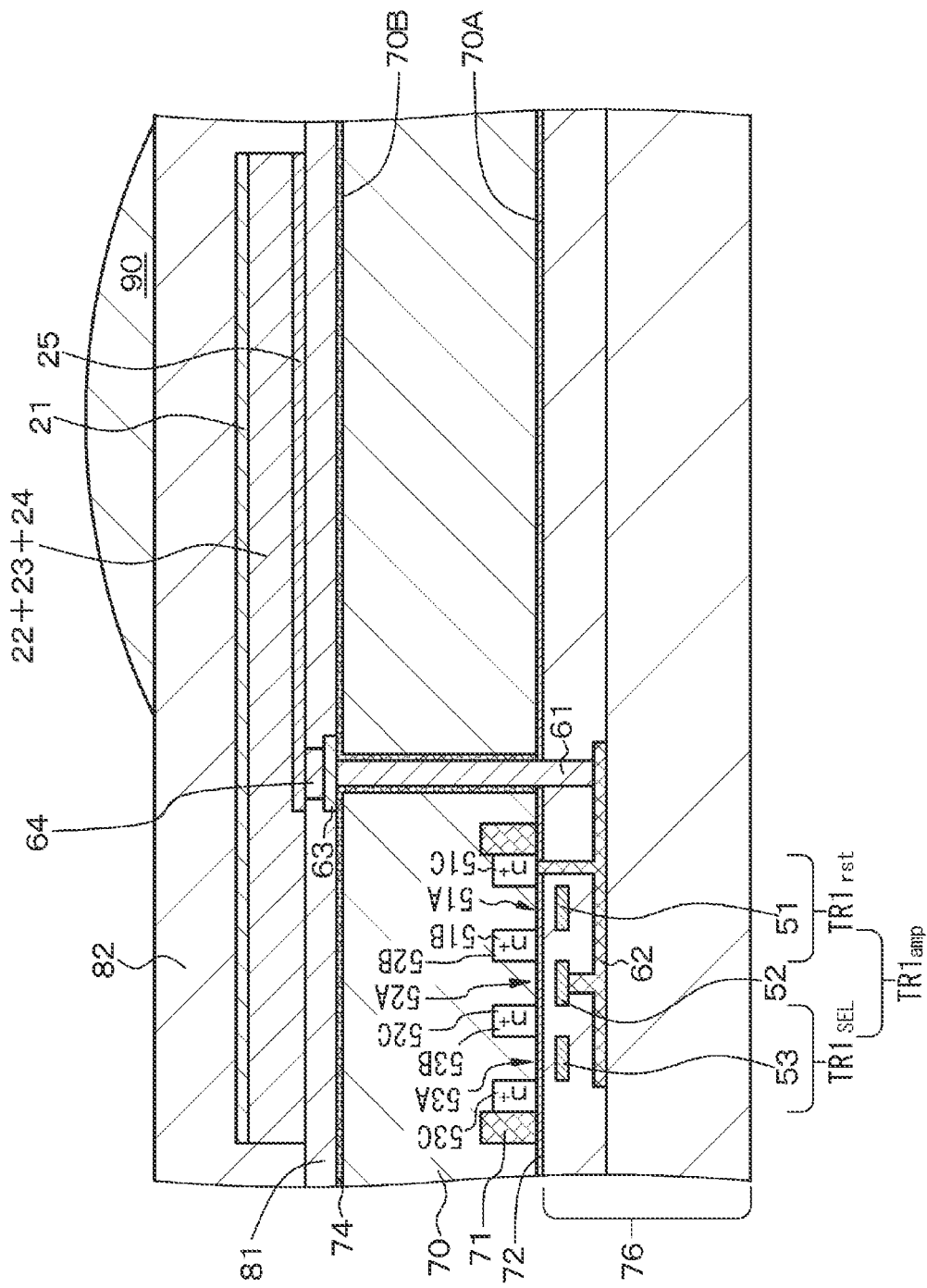
FIG. 11 is a schematic partial sectional view of a modified example of an imaging element (modified example-4) and a stacked-type imaging element of Embodiment 3.
Figure 12:
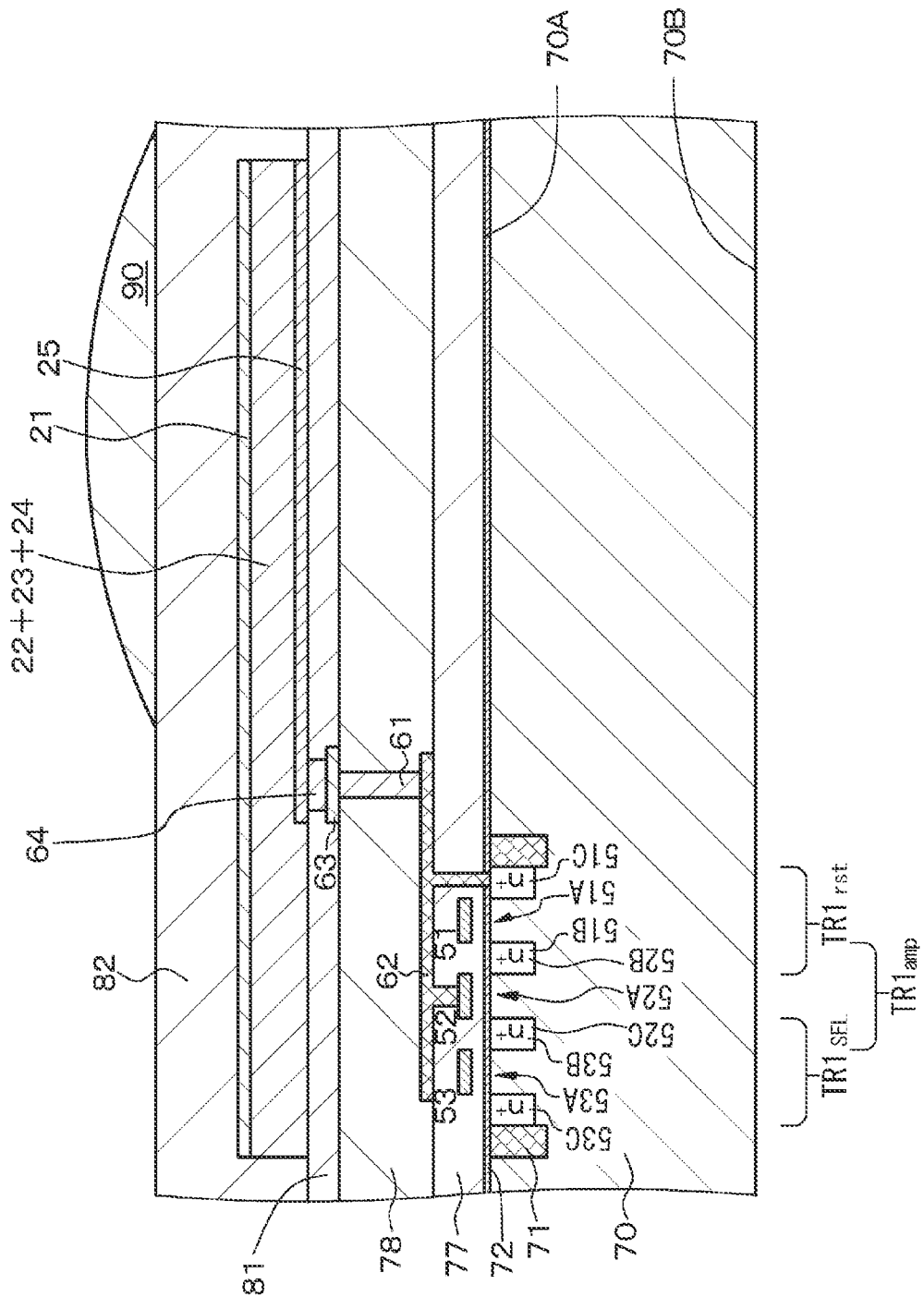
FIG. 12 is a schematic partial sectional view of a modified example of an imaging element (modified example-5) and a stacked-type imaging element of Embodiment 3.

The modified example-4 of the imaging element of Embodiment 3 of which a schematic partial sectional view is shown in FIG. 11 is a back surface illuminated type imaging element, and is formed of the first imaging element of the first type of Embodiment 1. Furthermore, the modified example-5 of the imaging element of Embodiment 3 of which a schematic partial sectional view is shown in FIG. 12 is a front surface illuminated type imaging element, and is formed of the first imaging element of the first type of Embodiment 1. Here, the first imaging element is formed of three types of imaging elements including an imaging element absorbing red light, an imaging element absorbing green light and an imaging element absorbing blue light. Moreover, the imaging apparatus according to the first aspect of the present disclosure is formed of a plurality of these imaging elements. An example of the arrangement of a plurality of the imaging elements includes a Bayer array. Color filters for performing spectral division of blue, green, and red are provided as necessary at the light incident side of each imaging element.

Further, the form in which two first-type imaging element of Embodiment 1 are stacked (i.e., form in which two photoelectric conversion units are stacked and control units of two imaging elements are provided on semiconductor substrate), or, the form in which three first-type imaging element are stacked (i.e., form in which three photoelectric conversion units are stacked and control units of three imaging elements are provided on semiconductor substrate) may be adopted instead of providing one imaging first-type element. An example of a stacked structure of the first-type imaging element and the second-type imaging element is exemplified in the following table 3.

TABLE 3

| | First type | Second type | Reference drawing |
|---|---|---|---|
| Back surface illuminated type and front surface illuminated type | 1<br>Green<br>1<br>Primary color<br>1<br>White<br>1<br>Blue or green or red<br>2<br>Green + infrared light<br>2<br>Green + blue<br>2<br>White + infrared light<br>3<br>Green + blue + red<br>3<br>Green + blue + red<br>3<br>Blue + green + red | 2<br>Blue + red<br>1<br>Complementary color<br>1<br>Infrared ray<br>0<br><br>2<br>Blue + red<br>1<br>Red<br>0<br><br>2<br>Blue-green (emerald color) + infrared light<br>1<br>infrared light<br>0 | FIG. 1<br>FIG. 8<br>FIG. 9<br>FIG. 10<br><br>FIG. 11<br>FIG. 12 |

Figure 13:
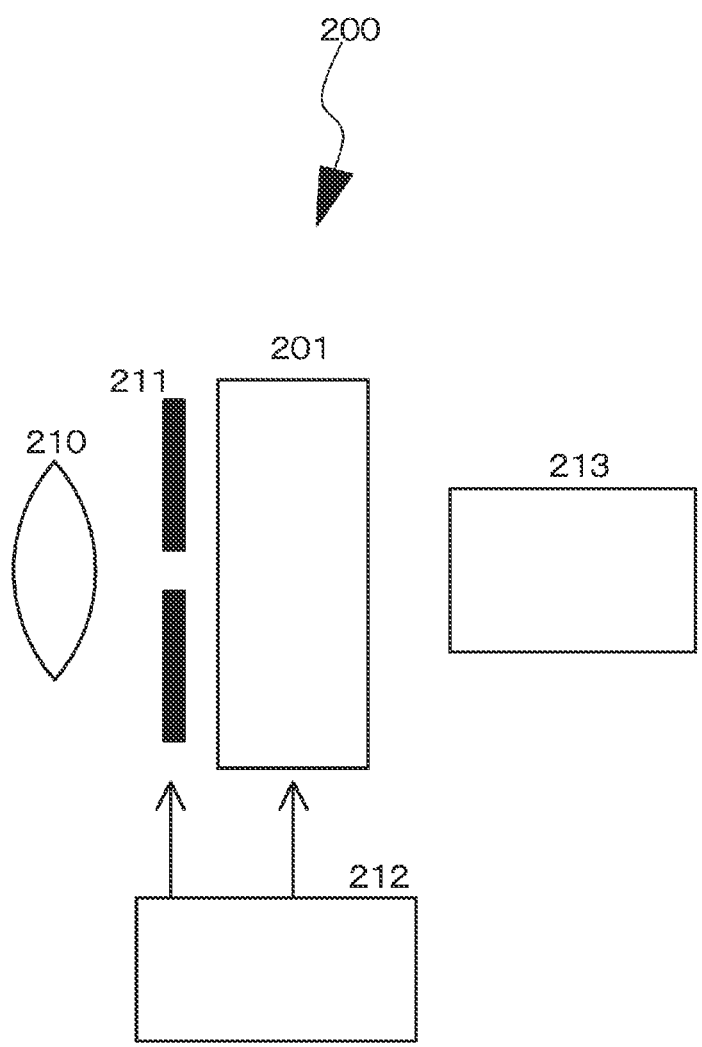
FIG. 13 is a conceptual diagram of an example in which an imaging apparatus formed of the imaging element and stacked-type imaging element according to an embodiment of the present disclosure is used in an electronic device (camera).

FIG. 13 is a conceptual diagram of an example in which an imaging apparatus 201 formed of the imaging element and stacked-type imaging element of the present disclosure is used in an electronic device (camera) 200. The electronic device 200 includes the imaging apparatus 201, an optical lens 210, a shutter device 211, a drive circuit 212, and a signal processing circuit 213. The optical lens 210 forms an image light (incident light) from a subject as an image on an imaging surface of the imaging apparatus 201. Thus, signal charges are accumulated in the imaging apparatus 201 for a given period. The shutter device 211 controls a light irradiation period and a light shielding period for the imaging apparatus 201. The drive circuit 212 supplies a drive signal for controlling a transfer operation or the like of the imaging apparatus 201 and a shutter operation of the shutter device 211. A signal of the imaging apparatus 201 is transferred in accordance with the drive signal (timing signal) supplied from the drive circuit 212. The signal processing circuit 213 performs various kinds of signal processing. A video signal subjected to the signal processing is stored in a storage medium such as a memory or is output to a monitor. Since miniaturization of a pixel size in the imaging apparatus 201 and transfer efficiency are improved in the electronic device 200, the electronic device 200 in which an improvement in pixel characteristics is achieved can be obtained. The electronic device 200 to which the imaging apparatus 201 can be applied is not limited to a camera and can also be applied to an imaging apparatus such as a digital still camera or a camera module for a mobile device such as a mobile phone.

The present disclosure has been described above according to preferred embodiments, but is not limited to these embodiments. The structures, the configurations, the manufacturing conditions, the manufacturing methods, and the used materials of the imaging element, the stacked-type imaging element, and the imaging apparatus described in the embodiments are exemplary and can be appropriately changed. In a case in which a photoelectric conversion element of the present disclosure is set to function as a solar cell, light may be irradiated to a photoelectric conversion material layer with no voltage applied between the anode and the cathode.

Additionally, the present technology may also be configured as below.

[A01]<<Imaging Element: First Aspect>>

An imaging element which is formed by sequentially stacking at least an anode, an anode-side buffer layer, a photoelectric conversion layer, and a cathode, in which the anode-side buffer layer includes a material having structural formula (1):

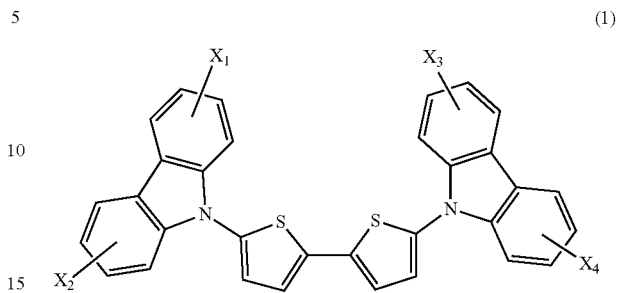

(1)

in which thiophene and carbazole are combined, where $X_1$, $X_2$, $X_3$, and $X_4$ are each independently a group consisting of an alkyl group, an aryl group, an arylamino group, an aryl group having an arylamino group as a substituent, and a carbazolyl group, and may or may not have a substituent, the aryl group and the aryl group having an arylamino group as a substituent are an aryl group selected from a group consisting of a phenyl group, a biphenyl group, a naphthyl group, a naphthyl phenyl group, a phenyl naphthyl group, a tolyl group, a xylyl group, a terphenyl group, an anthracenyl group, a phenanthryl group, a pyrenyl group, a tetracenyl group, a fluoranthenyl group, a pyridinyl group, a quinolinyl group, an acridinyl group, an indole group, an imidazole group, a benzimidazole group, and a thienyl group, and the alkyl group may be an alkyl group selected from a group consisting of a methyl group, an ethyl group, a propyl group, a butyl group, a pentyl group, and a hexyl group, or a linear or branched alkyl group.

[A02]<<Imaging Element: Second Aspect>>

An imaging element which is formed by sequentially stacking at least an anode, an anode-side buffer layer, a photoelectric conversion layer, and a cathode, in which the anode-side buffer layer includes a material having structural formula (2):

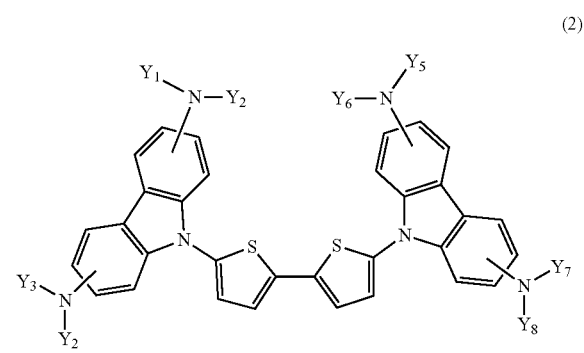

(2)

in which thiophene and carbazole are combined, where $Y_1$, $Y_2$, $Y_3$, $Y_4$, $Y_5$, $Y_6$, $Y_7$, and $Y_8$ are each independently a group consisting of an alkyl group, an aryl group, an arylamino group, an aryl group having an arylamino group as a substituent, and a carbazolyl group, and may or may not have a substituent, the aryl group and the aryl group having an arylamino group as a substituent are an aryl group selected from a group consisting of a phenyl group, a biphenyl group, a naphthyl group, a naphthyl phenyl group, a phenyl naphthyl group, a tolyl group, a xylyl group, a terphenyl group, an anthracenyl group, a phenanthryl group, a pyrenyl group, a tetracenyl group, a fluoranthenyl group, a pyridinyl group, a quinolinyl group, an acridinyl group, an indole group, an imidazole group, a benzimidazole group, and a thienyl group, and the alkyl group may be an alkyl group selected from a group consisting of a methyl group, an ethyl group, a propyl group, a butyl group, a pentyl group, and a hexyl group, or a linear or branched alkyl group.

[A03]<<Imaging Element: Third Aspect>>

An imaging element which is formed by sequentially stacking at least an anode, an anode-side buffer layer, a photoelectric conversion layer, and a cathode, in which the anode-side buffer layer includes a material having structural formula (3):

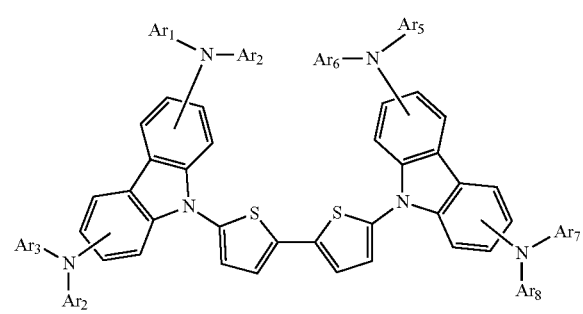

(3)

where $Ar_1$, $Ar_2$, $Ar_3$, $Ar_4$, $Ar_5$, $Ar_6$, $Ar_7$, and $Ar_8$ are each independently an aryl group selected from the group consisting of a phenyl group, a biphenyl group, a naphthyl group, a naphthyl phenyl group, a phenyl naphthyl group, a tolyl group, a xylyl group, a terphenyl group, an anthracenyl group, a phenanthryl group, a pyrenyl group, a tetracenyl group, a fluoranthenyl group, a pyridinyl group, a quinolinyl group, an acridinyl group, an indole group, an imidazole group, a benzimidazole group, and a thienyl group.

[A04]

The imaging element according to [A03], in which the anode-side buffer layer includes a material having structural formula (4) or structural formula (5):

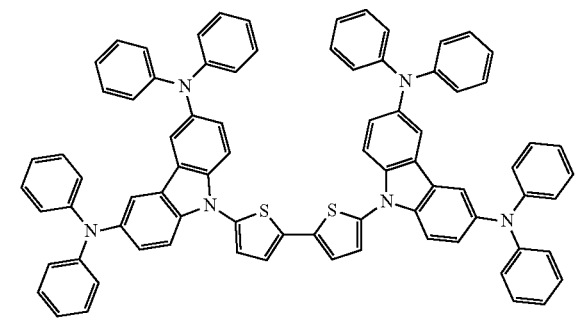

(4)

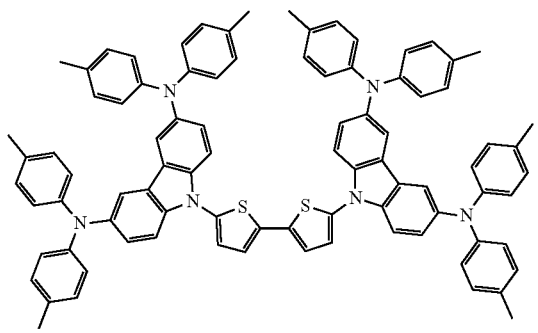

(5)

in which thiophene and carbazole are combined.

[A05]

The imaging element according to any one of [A01] to [A04], in which the difference between a HOMO value of the material forming the anode-side buffer layer and a HOMO value of a p-type material forming the photoelectric conversion layer is in the range of ±0.2 eV.

[A06]

The imaging element according to [A05], in which the HOMO value of the p-type material forming the photoelectric conversion layer is a value from −5.6 eV to −5.7 eV.

[A07]

The imaging element according to any one of [A01] to [A06], in which carrier mobility of the material forming the anode-side buffer layer is higher than or equal to $5 \times 10^{-6}$ cm$^2$/V·s.

[A08]

The imaging element according to any one of [A01] to [A07], in which an absorption spectrum of the material forming the anode-side buffer layer has an absorption maximum at a wavelength of 425 nm or lower.

[A09]

The imaging element according to any one of [A01] to [A08], in which the anode and the cathode are formed of a transparent conductive material.

[A10]

The imaging element according to any one of [A01] to [A08], in which one of the anode and the cathode is formed of a transparent conductive material and the other is formed of a metal material.

[B01]<<Stacked-Type Imaging Element>>

A stacked-type imaging element formed by stacking at least one imaging element according to any one of [A01] to [A10].

[C01]<<Imaging Apparatus: First Aspect>>

An imaging apparatus including:

a plurality of imaging elements according to any one of [A01] to [A10].

[C02]<<Imaging Apparatus: Second Aspect>>

An imaging apparatus including:

a plurality of stacked-type imaging elements according to [B01].

[D01]<<Photoelectric Conversion Element>>

An imaging element which is formed by sequentially stacking at least an anode, an anode-side buffer layer, a photoelectric conversion layer, and a cathode, in which the anode-side buffer layer includes a material having structural formula (1) or structural formula (2) or structural formula (3) or structural formula (4): in which thiophene and carbazole are combined.

[E01] <<Manufacturing Method of the Imaging Element>>

A manufacturing method of an imaging element which is formed by sequentially stacking at least an anode, an anode-side buffer layer, a photoelectric conversion layer, and a cathode, in which the anode-side buffer layer includes a material having structural formula (1), structural formula (2), structural formula (3), structural formula (4), or structural formula (5) in which thiophene and carbazole are combined, and the anode-side buffer layer is formed by using a physical vapor deposition method.

[E02] The manufacturing method of the imaging element described in [E01] in which the photoelectric conversion layer is also formed using the physical vapor deposition method.

[E03]

The manufacturing method of the imaging element described in [E01] or [E02], in which the difference between a HOMO value of the material forming the anode-side buffer layer and a HOMO value of a p-type material forming the photoelectric conversion layer is in the range of ±0.2 eV.

[E04]

The manufacturing method of the imaging element described in [E03], in which the HOMO value of the p-type material forming the photoelectric conversion layer is a value from −5.6 eV to −5.7 eV.

[E05]

The manufacturing method of the imaging element described in any one of [E01] to [E04], in which carrier mobility of the material forming the anode-side buffer layer is higher than or equal to $5 \times 10^6$ cm$^2$/V·s.

[E06]

The manufacturing method of the imaging element described in any one of [E01] to [E05], in which an absorption spectrum of the material forming the anode-side buffer layer has an absorption maximum at a wavelength of 425 nm or lower.

[E07]

The manufacturing method of the imaging element described in any one of [E01] to [E06], in which the anode and the cathode are formed of a transparent conductive material.

[E08]

The manufacturing method of the imaging element described in any one of [E01] to [E07], in which one of the anode and the cathode is formed of a transparent conductive material and the other is formed of a metal material.

REFERENCE SIGNS LIST 11 imaging element
20 substrate
21 anode
22 anode-side buffer layer
23 organic photoelectric conversion layer
24 cathode-side buffer layer
25 cathode
31 insulating layer
41 n-type semiconductor region forming second imaging element
43 n-type semiconductor region forming third imaging element
42, 44, 73 p$^+$ layer
FD$_1$, FD$_2$, FD$_3$, 45C, 46C floating diffusion layer
TR1$_{amp}$ amplification transistor
TR1$_{rst}$ reset transistor
TR1$_{sel}$ select transistor
51 the gate section of the reset transistor TR1$_{rst}$
51A channel forming region of reset transistor TR1$_{rst}$
51B, 51C source/drain regions of reset transistor TR1$_{rst}$
52 gate section of amplification transistor TR1$_{amp}$
52A channel forming region of amplification transistor TR1$_{amp}$
52B, 52C source/drain regions of amplification transistor TR1$_{amp}$
53 gate section of select transistor TR1$_{sel}$
53A channel forming region of select transistor TR1$_{sel}$
53B, 53C source/drain regions of select transistor TR1$_{sel}$
TR2$_{trs}$ transfer transistor
45 gate section of transfer transistor
TR2$_{trs}$ reset transistor
TR2$_{amp}$ amplification transistor
TR2$_{sel}$ select transistor
TR3$_{trs}$ transfer transistor
46 gate section of transfer transistor
TR3$_{rst}$ reset transistor
TR3$_{amp}$ amplification transistor
TR3$_{sel}$ select transistor
V$_{DD}$ power supply
RST$_1$, RST$_2$, RST$_3$ reset line
SEL$_1$, SEL$_2$, SEL$_3$ select line
117, VSL$_1$, VSL$_2$, VSL$_3$ signal line
TG$_2$, TG$_3$ transfer gate line
V$_{OA}$, V$_{OT}$, V$_{OU}$ wiring
61 contact hole portion
62 wiring layer
63 pad portion
64 connection hole
70 semiconductor substrate
70A first surface (front surface) of semiconductor substrate
70B second surface (back surface) of semiconductor substrate
71 element separation region
72 oxide film
74 HfO$_2$
75 insulating film
76 interlayer insulating layer
77, 78, 81 interlayer insulating layer
82 protective layer
90 on-chip microlens
100 imaging apparatus
101 stacked-type imaging element
111 imaging area
112 vertical drive circuit
113 column signal processing circuit
114 horizontal drive circuit
115 output circuit
116 drive control circuit
118 horizontal signal line
200 electronic device (camera)
201 imaging apparatus
210 optical lens
211 shutter device
212 drive circuit
213 signal processing circuit

What is claimed is:
1. A light detecting element comprising:
a first electrode;
a second electrode;
a photoelectric conversion layer disposed between the first electrode and the second electrode; and
a buffer layer disposed between the first electrode and the photoelectric conversion layer, wherein the photoelectric conversion layer comprises quinacridone derivatives or a thienoacene-based material, and wherein the buffer layer includes a material having structural formula (4) or structural formula (5):

(4)

(5)

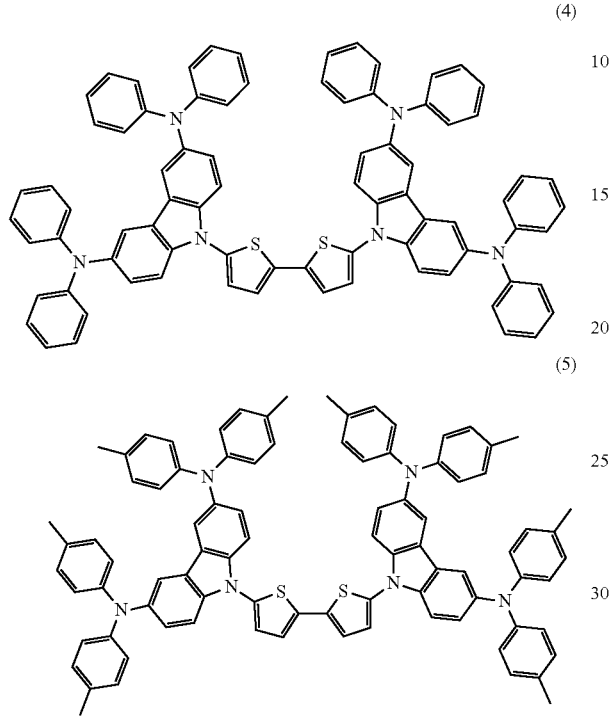

in which thiophene and carbazole are combined.

2. The light detecting element according to claim 1, wherein a difference between a HOMO value of the material forming the buffer layer and a HOMO value of a p-type material forming the photoelectric conversion layer is in a range of ±0.2 eV.

3. The light detecting element according to claim 2, wherein the HOMO value of the p-type material forming the photoelectric conversion layer is a value from −5.6 eV to −5.7 eV.

4. The light detecting element according to claim 1, wherein carrier mobility of the material forming the buffer layer is higher than or equal to $5\times10^{-6}$ cm$^2$/V·s.

5. The light detecting element according to claim 1, wherein an absorption spectrum of the material forming the buffer layer has an absorption maximum at a wavelength of 425 nm or lower.

6. The light detecting element according to claim 1, wherein the first electrode and the second electrode are formed of a transparent conductive material.

7. The light detecting element according to claim 1, wherein a first one of the first electrode and the second electrode is formed of a transparent conductive material and a second one of the first electrode and the second electrode is formed of a metal material.

8. A stacked-type light detecting element which is formed by stacking at least one light detecting element according to claim 1.

9. A light detecting apparatus comprising:
a plurality of light detecting elements according to claim 8.

10. A light detecting apparatus comprising:
a plurality of stacked-type light detecting elements according to claim 8.

11. The light detecting element according to claim 1,
wherein the photoelectric conversion layer includes two or three types of semiconductor materials,
as a p-type organic semiconductor material, at least any one of a naphthalene derivative, an anthracene derivative, a phenanthrene derivative, a pyrene derivative, a perylene derivative, a tetracene derivative, a pentacene derivative, a thiophene derivative, a thienothiophene derivative, a benzothiophene derivative, a benzothienobenzothiophene (BTBT) derivative, a dinaphthothienothiophene (DNTT) derivative, a diantrasenothienothiophene (DATT) derivative, a benzobisbenzothiophene (BBBT) derivative, a thienobis benzothiophene (TBBT) derivative, a dibenzothienobi sbenzothiophene (DB TB T) derivative, a dithienobenzodithiophene (DTBDT) derivative, a dibenzothienodithiophene (DBTDT) derivative, a benzodithiophene (BDT) derivative, a naphthodithiophene (NDT) derivative, an anthracenodithiophene (ADT) derivative, a tetrasenodithiophene (TDT) derivative, a pentasenodithiophene (PDT) derivative, a triallylamine derivative, a carbazole derivative, a picen derivative, a chrysen derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, and a polyfluorene derivative is included, and
as an n-type organic semiconductor material, at least any one of fullerene, a fullerene derivative, a heterocyclic compound containing a nitrogen atom, an oxygen atom, and a sulfur atom, a pyridine derivative, a pyrazine derivative, a pyrimidine derivative, a triazine derivative, a quinoline derivative, a quinoxaline derivative, an isoquinoline derivative, an acridine derivative, a phenazine derivative, a benanthroline derivative, a tetrazole derivative, a pyrazole derivative, an imidazole derivative, a thiazole derivative, an oxazole derivative, an imidazole derivative, a benzimidazole derivative, a penzotriazole derivative, a benzoxazole derivative, a benzoxazole derivative, a carbazole derivative, a benzofuran derivative, a dibenzofuran derivative, a subporphyrazine derivative, a polyphenylene vinylene derivative, a polybenzothiadiazole derivative, a polyfluorene derivative, and a subphthalocyanine derivative is included.

12. The light detecting element according to claim 1, wherein the photoelectric conversion layer includes crystal silicon, amorphous silicon, microcrystalline silicon, crystalline selenium, amorphous selenium, and a compound semiconductor material including CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, or AgInSe$_2$, which is a chalcopyrite-based compound, GaAs, InP, AlGaAs, InGaP, AlGaInP, or InGaAsP, which is a Group III-V compound, and further CdSe, CdS, In2Se$_3$, In$_2$S$_3$, Bi$_2$Se$_3$, Bi$_2$S$_3$, ZnSe, ZnS, Pb Se, or PbS, and/or a quantum dot formed of any of these materials.

* * * * *